(12) United States Patent
Sukekawa

(10) Patent No.: US 10,410,912 B2
(45) Date of Patent: Sep. 10, 2019

(54) INTEGRATED CIRCUITRY

(71) Applicant: Micron Technology, Inc., Boise, ID (US)

(72) Inventor: Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/002,162

(22) Filed: Jun. 7, 2018

(65) Prior Publication Data

US 2019/0019722 A1    Jan. 17, 2019

Related U.S. Application Data

(63) Continuation of application No. 15/650,274, filed on Jul. 14, 2017, now Pat. No. 10,103,053.

(51) Int. Cl.
*H01L 21/762* (2006.01)
*H01L 21/768* (2006.01)
(Continued)

(52) U.S. Cl.
CPC .... *H01L 21/76256* (2013.01); *H01L 21/3105* (2013.01); *H01L 21/76898* (2013.01); *H01L 29/66772* (2013.01); *H01L 29/78603* (2013.01)

(58) Field of Classification Search
None
See application file for complete search history.

(56) References Cited

U.S. PATENT DOCUMENTS

| 7,385,283 | B2 | 6/2008 | Wu et al. |
| 9,087,821 | B2 | 7/2015 | Lin |

(Continued)

FOREIGN PATENT DOCUMENTS

| JP | 05217972 A | 8/1993 |
| JP | 2014-053431 A | 3/2014 |
| WO | WO 2009/096465 | 8/2009 |

OTHER PUBLICATIONS

Liu et al., "Low-temperature direct copper-to-copper bonding enabled for creep on (111) surfaces of nanotwinned Cu", Scientific Reports, May 12, 2015, 11 pgs.

(Continued)

*Primary Examiner* — Asok K Sarkar
(74) *Attorney, Agent, or Firm* — Wells St. John P.S.

(57) ABSTRACT

Some embodiments include methods in which a structure has a first semiconductor material over a dielectric region, a second semiconductor material under the dielectric region, an insulative wall laterally surrounding a volume of the first semiconductor material, and a first doped region along a lower surface of the first semiconductor material. The first semiconductor material is patterned to form a pillar within a tub. The pillar has top and bottom portions. An upper doped region is formed within the pillar top portion. A dielectric liner is formed to extend along the pillar, and to extend along the bottom of the tub. Conductive gate material is formed within the tub and over the dielectric liner. The lower and upper doped regions within the pillar are first and second source/drain regions, respectively, and the conductive gate material includes a transistor gate which gatedly couples the first and second source/drain regions.

20 Claims, 17 Drawing Sheets

(51) Int. Cl.
*H01L 29/66* (2006.01)
*H01L 29/786* (2006.01)
*H01L 21/3105* (2006.01)

(56) References Cited

U.S. PATENT DOCUMENTS

| | | | |
|---|---|---|---|
| 9,147,650 B2 | 9/2015 | Hagimoto et al. | |
| 9,230,941 B2 | 1/2016 | Chen et al. | |
| 9,245,893 B1 | 1/2016 | Sukekawa et al. | |
| 9,257,399 B2 | 2/2016 | Kuang et al. | |
| 9,666,573 B1 | 5/2017 | Sukekawa | |
| 2006/0006444 A1* | 1/2006 | Leslie | H01L 27/10876 257/300 |
| 2013/0228869 A1 | 9/2013 | Masuoka et al. | |
| 2017/0194248 A1* | 7/2017 | Das | H01L 27/1266 |
| 2018/0061760 A1* | 3/2018 | Lou | H01L 21/76889 |
| 2018/0068886 A1* | 3/2018 | Hammond | H01L 21/76259 |
| 2018/0138164 A1* | 5/2018 | Lee | H01L 21/3065 |
| 2018/0175034 A1* | 6/2018 | Goktepeli | H01L 21/76897 |
| 2018/0226390 A1* | 8/2018 | Kang | H01L 21/187 |

OTHER PUBLICATIONS

Matthias et al., "Wafer Bonding for Backside Illuminated Image Sensors", ECS Transactions, vol. 44(1), Jun. 2012, pp. 1269-1274.

Radu et al., "Recent developments of Cu-Cu non-thermo compression bonding for wafer-to-wafer 3D stacking", 3D Systems Integration Conference (3DIC), 2010 IEEE International Conference, Munich, Germany, Nov. 16-18, 2010, 6 pgs.

Teh et al., "Post-Bond Sub-500 nm Alignment in 300 mm Integrated Face-to-Face Wafer-to-Wafer Cu-Cu Thermocompression, Si-Si Fusion and Oxide-Oxide Fusion Bonding", 3D Systems Integration Conference (3DIC), Munich. Germany, Nov. 16-16, 2010, 6 pgs.

Tezzaron Semiconductor Corporation, "Tezzaron Announces World's First Eight-Layer Active Wafer Stack," The Tezzblog, Sendai, Japan, Aug. 31, 2015, downloaded from https://tezzaron.com/tezzaron-announces-worlds-first-eight-layer-active-wafer-stack/ on May 30, 2017.

* cited by examiner

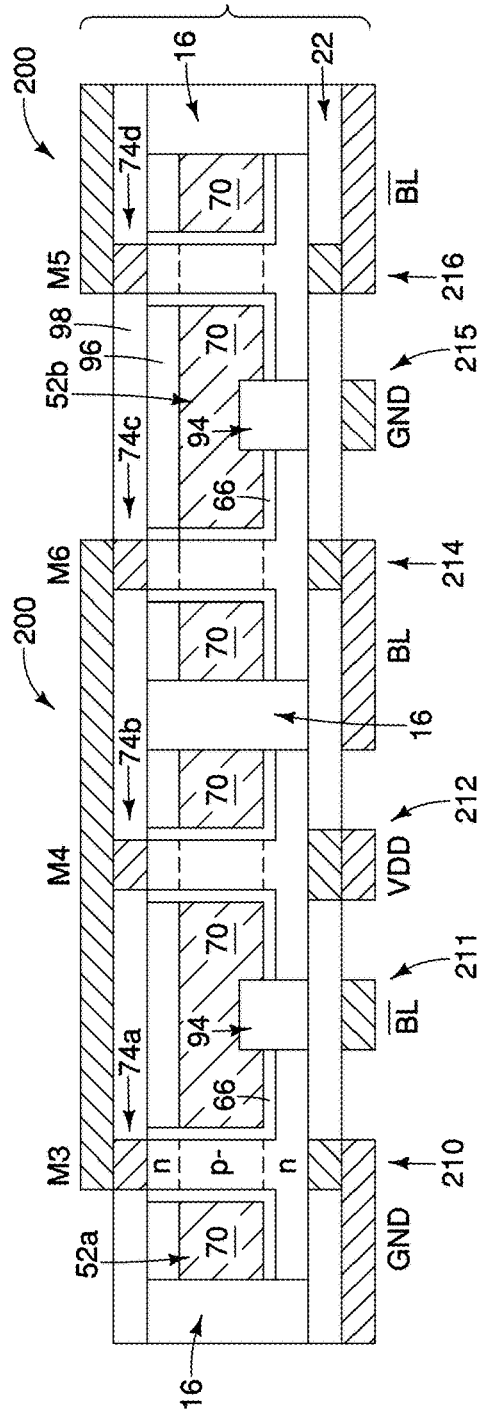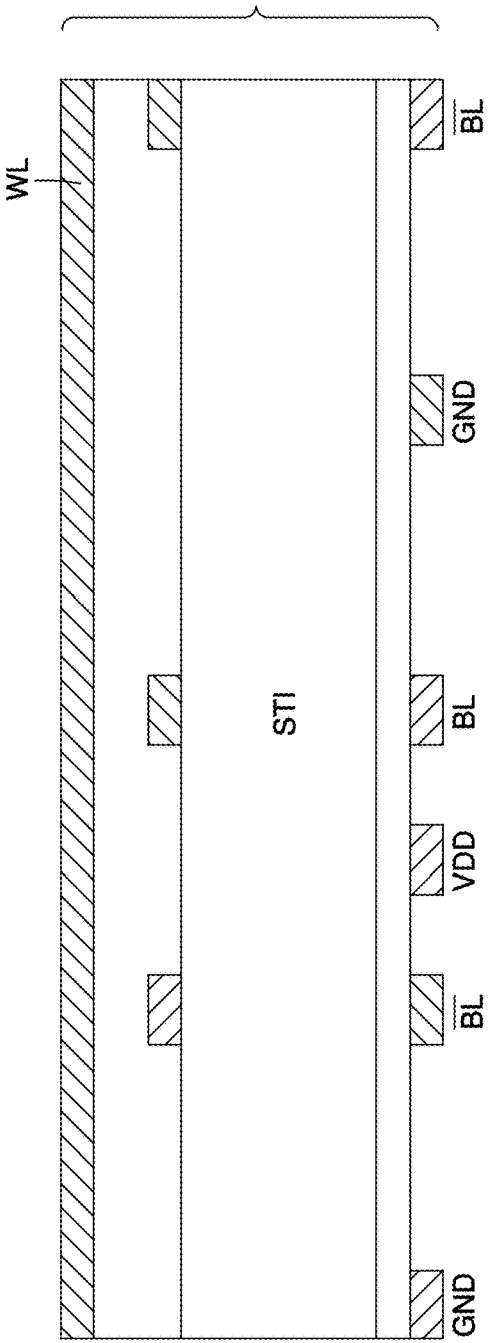

INTEGRATED CIRCUITRY

RELATED PATENT DATA

This patent resulted from a continuation of U.S. patent application Ser. No. 15/650,274, which was filed Jul. 14, 2017, and which is hereby incorporated herein by reference.

TECHNICAL FIELD

Methods of forming integrated circuitry utilizing wafer level bonding technologies.

BACKGROUND

Transistors may be utilized in numerous applications, such as, for example, dynamic random access memory (DRAM), static random access memory (SRAM), etc. A field-effect transistor (FET) comprises a gated channel region between a pair of source/drain regions.

A continuing goal of semiconductor fabrication is to increase the density of integration. It is therefore desired to develop improved FET architectures which are suitable for utilization in highly-integrated architectures, and to develop methods for fabricating such FET architectures.

Wafer bonding is a methodology which may have application relative to integrated assemblies. Wafer bonding comprises the bonding of two semiconductor assemblies to one another to form a composite structure. One method of wafer bonding comprises formation of silicon dioxide surfaces across each of the assemblies which are to be bonded to one another. The silicon dioxide surfaces are then placed against one another, and subjected to appropriate treatment to induce covalent bonding between the surfaces and thereby form the composite structure. The treatment utilized to induce the covalent bonding may be a thermal treatment. In some aspects, such thermal treatment may utilize a temperature in excess of 800° C. Alternatively, one or both of the silicon dioxide surfaces may be subjected to a plasma treatment prior to the thermal treatment, and in such aspects the temperature of the thermal treatment may be reduced to a temperature within a range of from about 150° C. to about 200° C. The bonding of the silicon dioxide surfaces to one another may be referred to as "hybrid bonding".

BRIEF DESCRIPTION OF THE DRAWINGS

FIGS. 20A and 20B are cross-sectional views along the lines A-A and B-B of FIG. 20, respectively.

DETAILED DESCRIPTION OF THE ILLUSTRATED EMBODIMENTS

Figure 1:
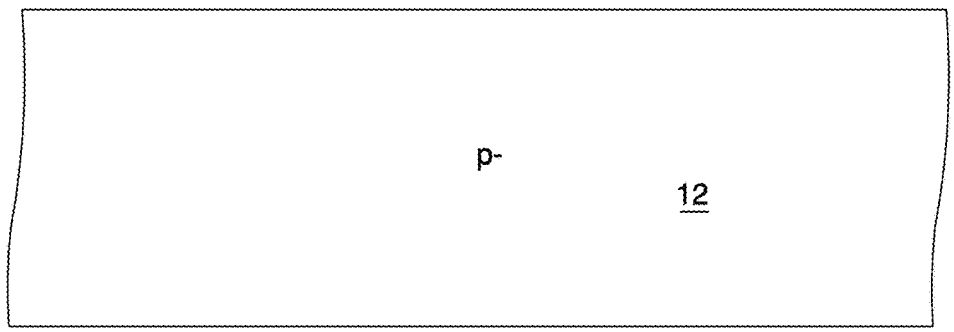
FIGS. 1-6 are diagrammatic cross-sectional side views of example structures at example process stages during fabrication of an example vertical transistor.

Some embodiments include methods of fabricating transistors in which a contact to a first source/drain is fabricated as part of a first assembly. The first assembly is then bonded to a second assembly to form a hybrid structure, with the contact being buried beneath the first source/drain region. The hybrid structure may have a volume of semiconductor material laterally surrounded by an insulative wall, and a pillar may be fabricated from such volume. The pillar has a lower portion comprising the first source/drain region, and has an upper portion which is doped to form a second source/drain region. The pillar is within a tub bounded by the insulative wall. Subsequently, dielectric material is formed along a sidewall of the pillar and the bottom the tub, and then gate material is formed over the dielectric material. The gate material, together with the first and second source/drain regions, forms a vertical transistor. It can be advantageous to form the vertical transistor as part of a hybrid structure, in that such may simplify formation of the contact to the bottom source/drain region.

In some embodiments, the vertical transistor may be one of a pair of vertical transistors fabricated within the same tub. The paired vertical transistors may be utilized in numerous architectures; and in example embodiments may be neighboring transistors of a dynamic random access memory (DRAM) array, may be a load transistor and a driver transistor of an inverter of a static random access memory (SRAM) array, etc.

FIGS. 1-21 illustrate example methods and structures.

Some of the figures show various different dopant levels, and utilize some or all of the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. It is noted that regions identified as being n−, n and n+ will have dopant concentrations similar to those described above relative to the p−, p and p+ regions respectively, except, of course, the n regions will have an opposite-type conductivity-enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the term "p− type doped" and "n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

Referring to FIG. 1, a region of a semiconductor material 12 is illustrated. The semiconductor material 12 may comprise any suitable composition or combination of compositions; and in some embodiments may comprise, consist essentially of, or consist of appropriately-doped monocrystalline silicon. For instance, the semiconductor material 12 may be p-type monocrystalline silicon in some embodiments, with the p-type doping being to the "p−" (p minus) dopant level.

Figure 2:
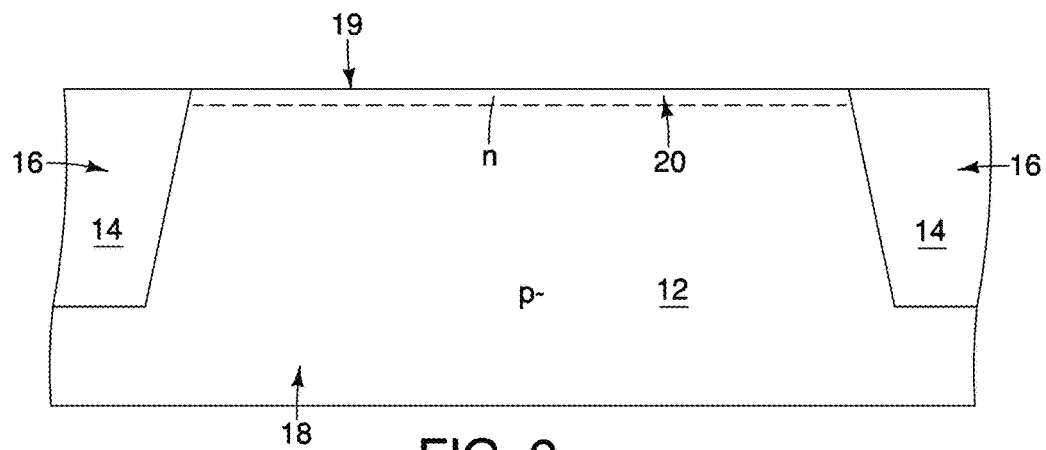

Referring to FIG. 2, insulative material 14 is formed to extend into the semiconductor material 12. The insulative material 14 may comprise any suitable composition or combination of compositions; and in some embodiments may comprise, consist essentially of, or consist of silicon dioxide. The insulative material 14 may be formed utilizing any suitable processing, including, for example, processing conventionally utilized for forming shallow trench isolation (STI).

Although the insulative material 14 appears to form two separate structures in the cross-sectional view of FIG. 2, in practice the insulative material may wrap around a volume of the semiconductor material 12 (as shown and described below with reference to FIG. 6A). In some embodiments, the insulative material 14 may be considered to form an insulative wall 16 which laterally surrounds a volume 18 of the semiconductor material 12. In some embodiments, the insulative wall 16 may be alternatively referred to as an insulative boundary structure or an insulative periphery.

A doped region 20 is formed along an upper surface 19 of the semiconductor material 12, with an approximate lower region of the doped region 20 being illustrated with a dashed line. In some embodiments, the doped region 20 may be an n-type doped region, and may be doped to the n dopant level.

In some embodiments, it may be advantageous that the doped region 20 be formed to be very shallow within the semiconductor material 12. For instance, in some embodiments the doped region 20 may extend to a depth of, for example, no greater than about 30 nanometers (nm), no greater than about 20 nm, or even less than or equal to about 10 nm.

Figure 3:
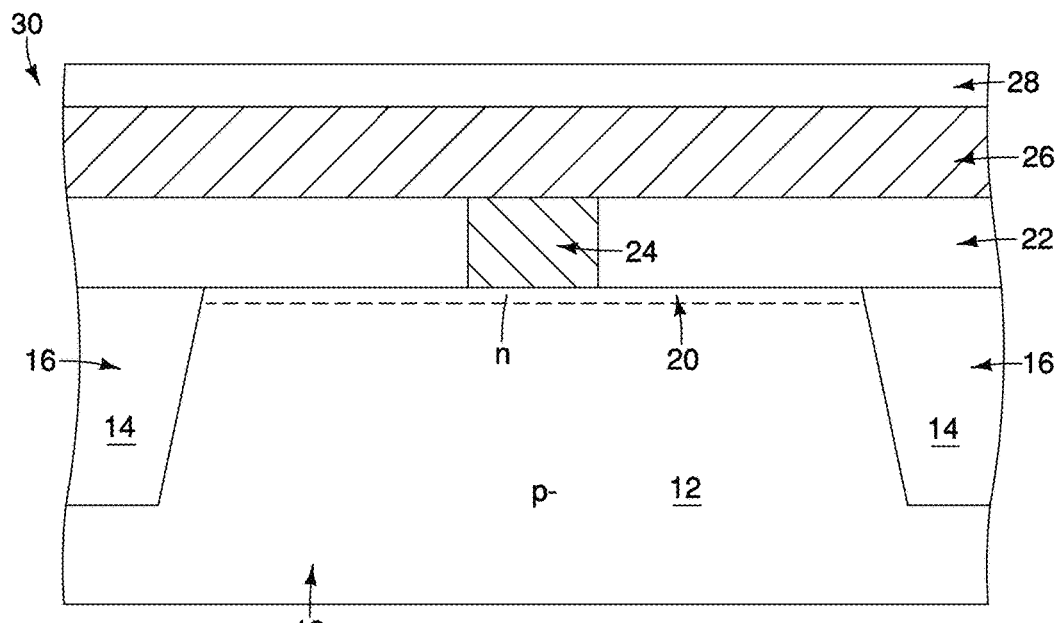

Referring to FIG. 3, an insulative layer 22 is formed over the doped region 20, and a conductive plug 24 is formed to extend through the insulative layer 22. The conductive plug is electrically coupled with the doped region 20, and in the shown embodiment directly contacts the doped region 20.

The insulative layer 22 may comprise any suitable composition or combination of compositions; and in some embodiments may comprise, consist essentially of, or consist of one or more of silicon dioxide, silicon nitride, etc.

The conductive plug 24 may comprise any suitable electrically conductive material(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive plug may comprise one or both of tungsten and titanium nitride.

A conductive rail 26 is over the insulative layer 22 and electrically coupled with the conductive plug 24.

The conductive rail 26 may comprise any suitable electrically conductive material(s), such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The conductive rail 26 may comprise a same composition as the conductive plug 24, or may comprise a different composition relative to the conductive plug 24. In some embodiments, the conductive rail may comprise tungsten.

A bonding dielectric material 28 is formed over the conductive rail 26. The bonding dielectric material may, for example, comprise, consist essentially of, or consist of silicon dioxide.

The configuration of FIG. 3 may be considered to correspond to a first assembly 30.

Figure 4:
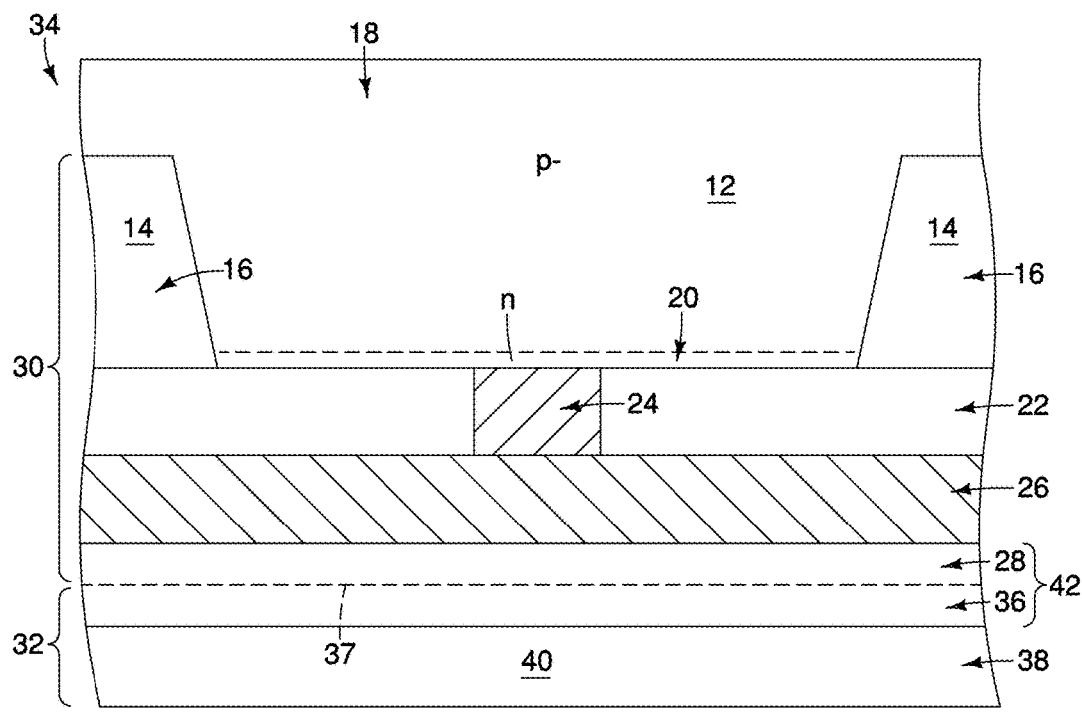

Referring to FIG. 4, the first assembly 30 is bonded (or otherwise joined) to a second assembly 32 to form a hybrid structure 34. The second assembly 32 comprises a bonding dielectric material 36 over a semiconductor substrate 38.

The bonding dielectric material 36 may, for example, comprise, consist essentially of, or consist of silicon dioxide. The bonding dielectric materials 28 and 36 may be bonded to one another utilizing wafer bonding methodologies of the type described above in the Background section. A dashed line 37 is provided to illustrate an approximate interface between the bonding dielectric materials 28 and 36. The bonding materials 28 and 36 together form a dielectric bonding region 42 of the hybrid structure 34.

In some embodiments, the first assembly 30 may be referred to as an upper structure over the dielectric bonding region 42, and the second assembly 32 may be referred to as a lower structure under the dielectric bonding region 42.

The semiconductor substrate 38 includes semiconductor material 40. Such semiconductor material may, for example, comprise, consist essentially of, or consist of monocrystalline silicon.

The second assembly 32 may be formed utilizing any suitable processing. In some embodiments, the semiconductor material 40 may be directly adjacent the bonding dielectric material 36, as shown; and in other embodiments there may be additional materials and/or structures between the bonding dielectric material 36 and the semiconductor material 40.

The semiconductor substrate 38 may comprise multiple materials and/or structures in addition to the semiconductor material 40. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the semiconductor substrate 38 may include circuitry (e.g., logic, wiring, sensors, etc.), and the various materials associated with such circuitry. Such materials may include, for example, one or more of refractory metal materials, barrier materials, diffusion materials, insulator materials, etc.

In some embodiments, the bonding dielectric materials 28 and 36 may be referred to as first and second bonding dielectric materials, respectively; and the semiconductor materials 12 and 40 may be referred to as first and second semiconductor materials, respectively.

Notably, the first assembly 30 of FIG. 4 is inverted relative to the configuration of FIG. 3 so that the doped region 20 is now shown to be along a lower region of the semiconductor material 12. In the illustrated configuration of FIG. 4, the semiconductor material 12 extends upwardly to above the insulative wall 16.

Figure 5:
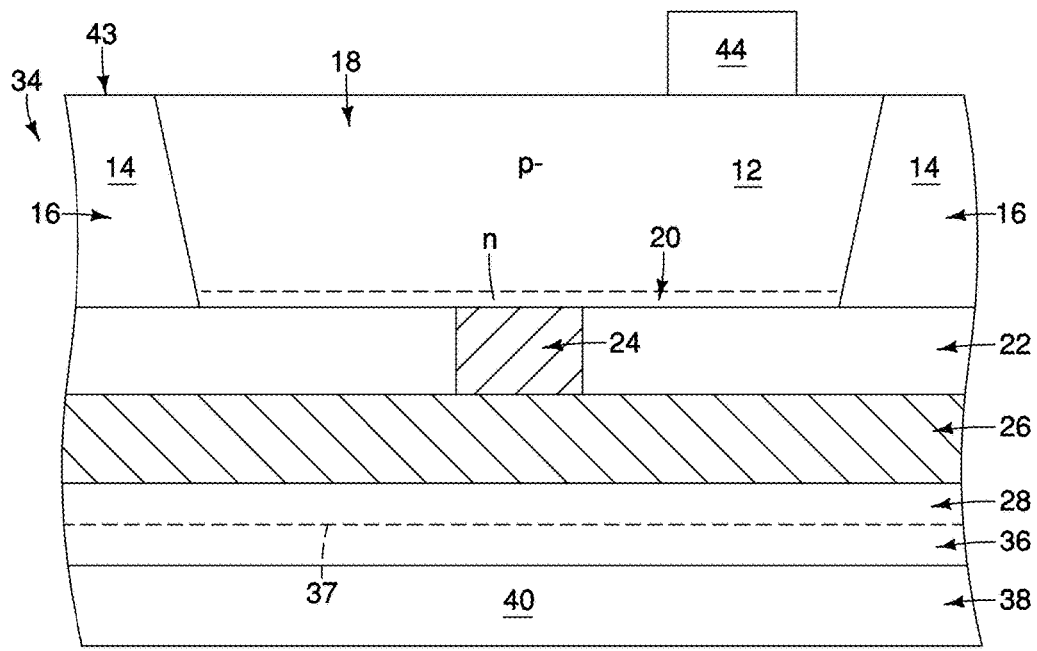

Referring to FIG. 5, the hybrid structure 34 is subjected to polishing and/or other suitable processing to form a planarized surface 43 extending across the semiconductor material 12 and the insulative wall 16. In some embodiments, the planarized surface 43 may be formed utilizing chemical-mechanical polishing (CMP) in combination with one or more wet etches selective for the semiconductor material 12 relative to the insulative material 14. Example polishing processes are described in more detail below with reference to FIGS. 10-14.

Referring still to FIG. 5, a patterned masking material 44 is formed on the planarized surface 43. The masking material 44 may comprise any suitable composition or combination of compositions; and in some embodiments may comprise, consist essentially of, or consist of silicon nitride. The masking material 44 may be patterned utilizing any suitable processing. For instance, an expanse of material 44 may be formed across the planarized surface 43, and then patterned utilizing a photolithographically-patterned photoresist mask (not shown) and one or more suitable etches.

Figure 6:
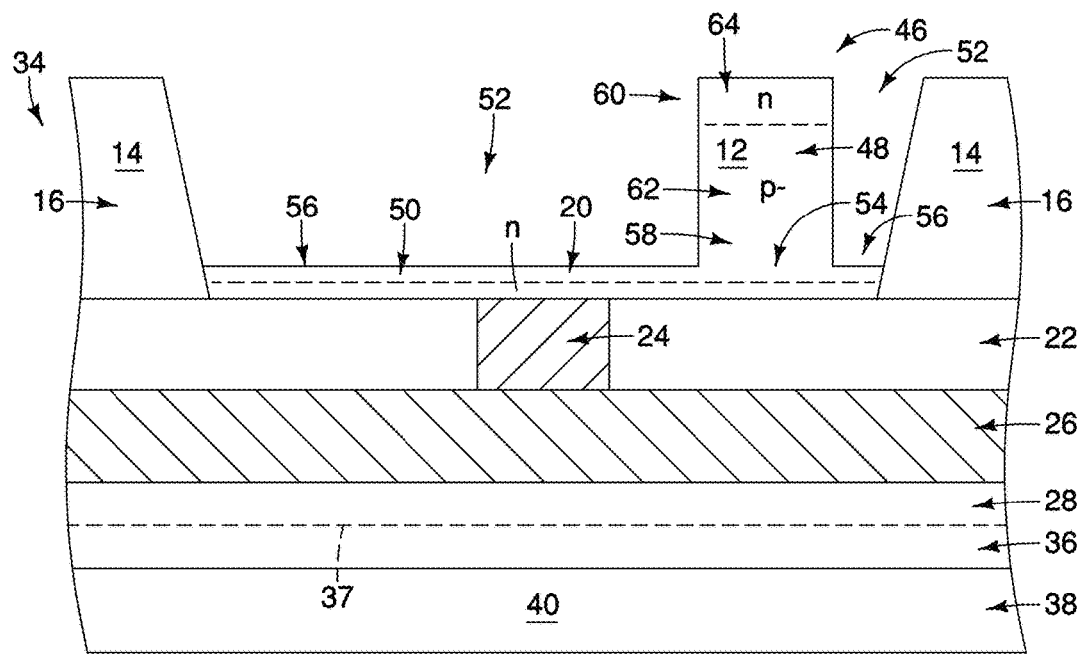
Figure 6A:
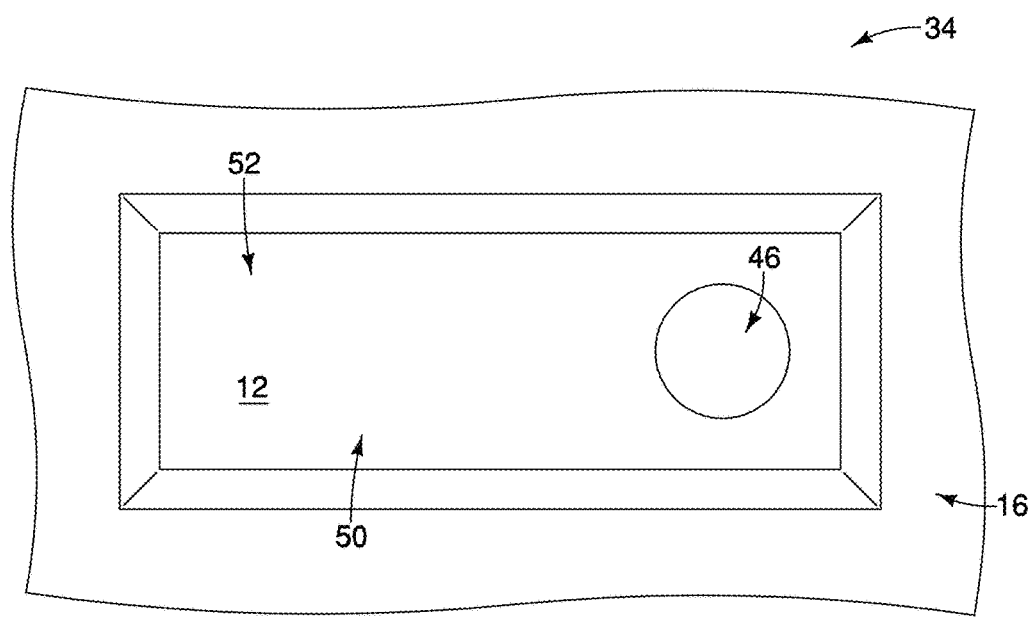
FIG. 6A is diagrammatic top view of the example structure at the example processing stage of FIG. 6.

Referring to FIG. 6, a pattern of masking material 44 (FIG. 5) is transferred into the semiconductor material 12, and then the masking material 44 is removed. The patterning of the semiconductor material 12 forms a pillar 46 from a first region (i.e., portion) 48 of the semiconductor material 12, and recesses a remaining second portion 50 of the semiconductor material 12. The insulative boundary structure 16, together with the second portion 50 of semiconductor material 12, define a tub (i.e., container) 52, as shown in the top view of FIG. 6A. The pillar 46 is within such tub 52.

Referring again to FIG. 6, the pillar 46 extends upwardly from a first area 54 of the doped region 20, and a bottom of the tub 52 comprises a second area 56 of the doped region 20.

The pillar 46 has a bottom portion 58, a top portion 60, and a central portion 62 between the top and bottom portions. The bottom portion 58 of the pillar 46 includes the n-type region 20 of semiconductor material 12, and the central portion 62 includes a p-type region of the semiconductor material 12. The top portion of the pillar 46 is doped to correspond to an upper doped region 64. Such upper doped region 64 may be an n-type (as shown).

The upper doped region 64 may be formed with any suitable processing. For instance, in some embodiments the doped region 20 of FIG. 5 may correspond to a first doped region, and a second doped region may be formed along an upper surface of the semiconductor material 12. Such second doped region may then be patterned during the formation of pillar 46 to form the upper doped region 64. Alternatively, the upper doped region 64 may be formed with an implant into the upper portion 60 of pillar 46 conducted after such pillar is patterned from the semiconductor material 12.

The doped regions 20 and 64 within pillar 12 may be referred to as lower and upper doped regions, respectively; or as first and second doped regions, respectively. The doped regions 20 and 64 ultimately correspond to source/drain regions of a vertical transistor, and the p-type central portion 62 ultimately corresponds to a channel region of such transistor. If additional channel doping is desired, such may be conducted at any suitable process stage, including, for example, after the polishing to form the planarized upper surface 43 of FIG. 5, and prior to the patterning of pillar 46 of FIG. 6.

Figure 7:
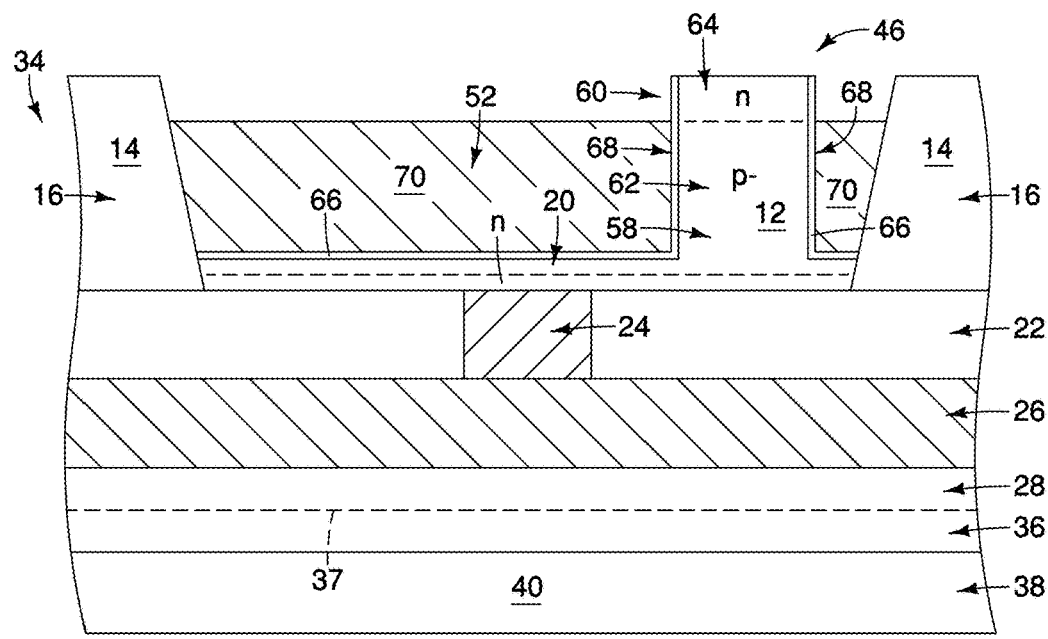
FIGS. 7 and 8 are diagrammatic cross-sectional side views of example structures at example process stages, with the process stage of FIG. 7 following that of FIG. 6.

Referring to FIG. 7, dielectric material 66 is formed to extend along sidewalls of the pillar 46 and within the bottom of the tub 52, with such dielectric material forming a dielectric liner 68. Subsequently, conductive gate material 70 is formed within the tub 52 and over the dielectric liner 68.

The dielectric material 66 may comprise any suitable composition or combination of compositions; and in some embodiments may comprise, consist essentially of, or consist of silicon dioxide. The dielectric material 66 may be referred to as gate dielectric material.

The conductive gate material 70 may comprise any suitable composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive gate material 70 may comprise, consist essentially of, or consist of appropriately-doped polycrystalline silicon.

Figure 8:
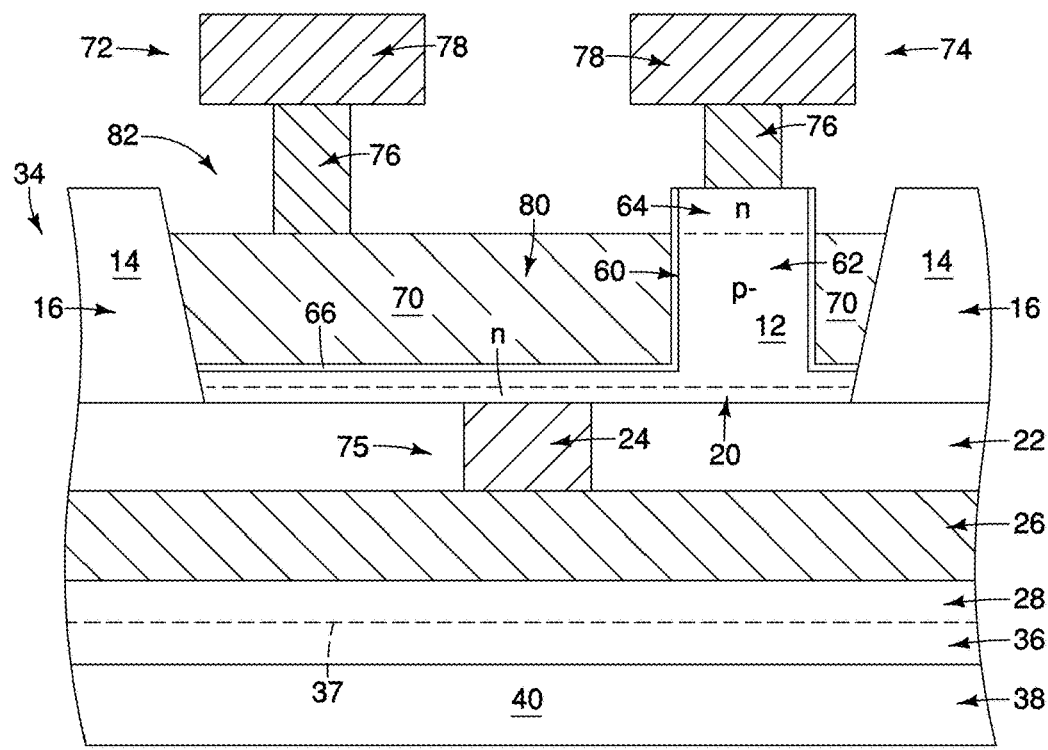
Figure 9:
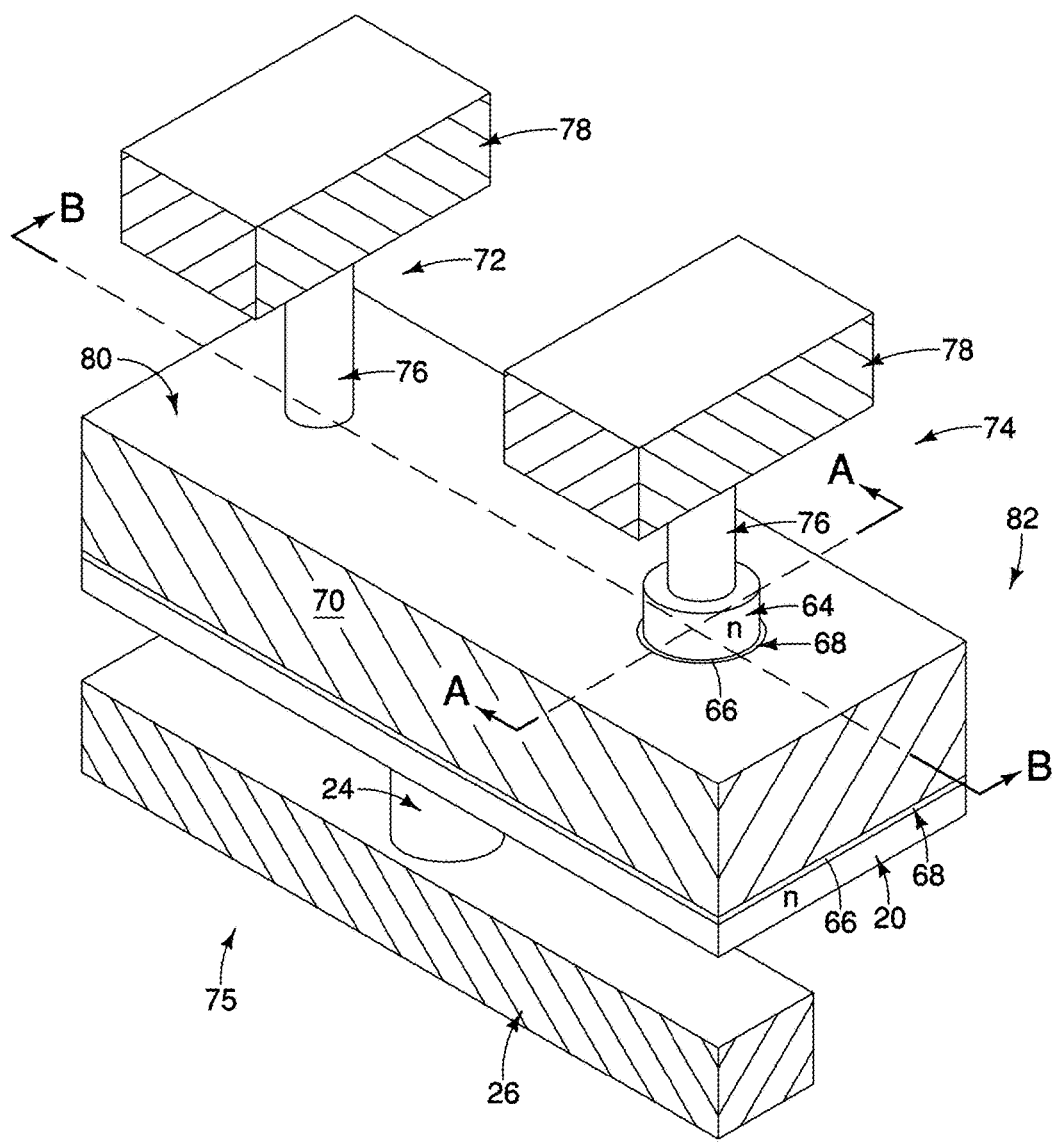
FIG. 9 is a three-dimensional view of an example vertical transistor.
Figure 9A:
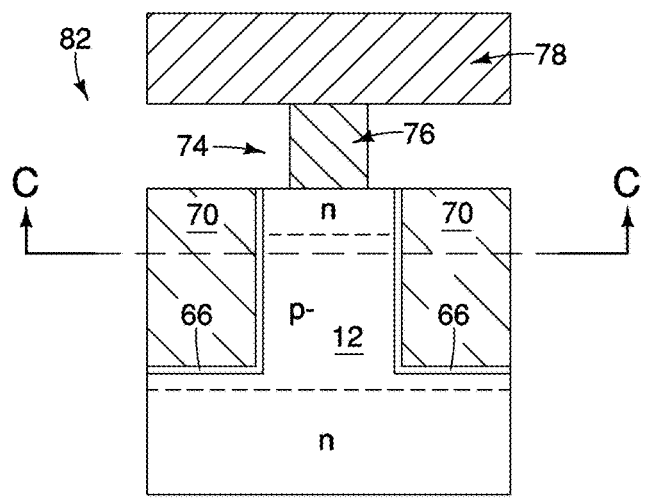
FIGS. 9A, 9B are cross-sectional views along the lines A-A and B-B of FIG. 9, respectively.
Figure 9B:
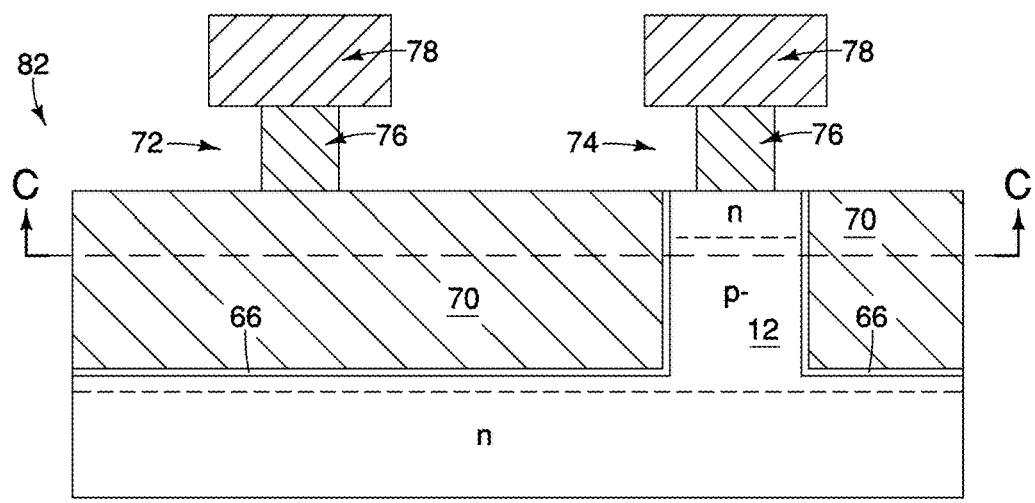
Figure 9C:
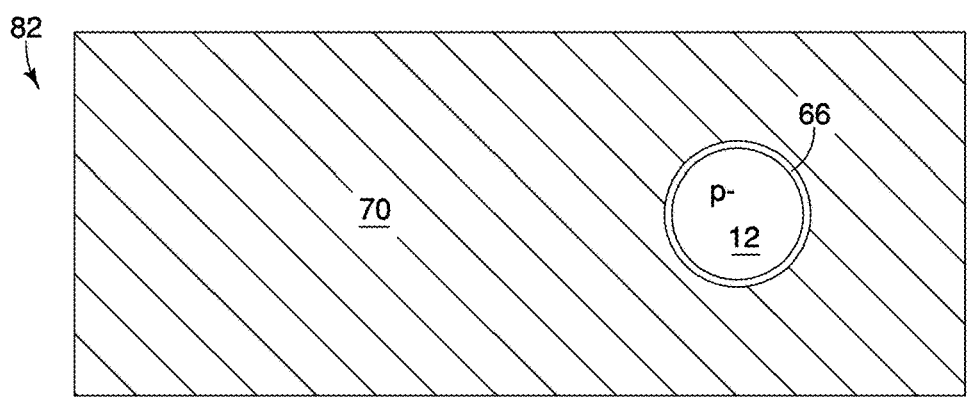
FIG. 9C is a view along the lines C-C of FIGS. 9A and 9B.

Referring to FIG. 8, a conductive interconnect 72 is electrically coupled with the conductive gate material 70, and a conductive interconnect 74 is electrically coupled with the upper doped region 64. Also, the rail 26 and conductive plug 24 together form a conductive interconnect 75 electrically coupled with the lower doped region 20.

The conductive interconnects 72 and 74 may comprise any suitable compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive interconnects include pedestals 76 comprising one or both of tungsten and titanium; with such pedestals being coupled with conductive components 78 which may comprise metal (e.g., tungsten, titanium, aluminum, copper, etc.), or any other suitable composition(s). In some embodiments, the pedestals 76 may comprise a same composition as the conductive components 78; and in other embodiments the pedestals 76 may comprise different compositions relative to the conductive components 78.

The conductive gate material 70 comprises a transistor gate 80 of a vertical transistor 82. The vertical transistor 82 includes the upper source/drain region 64 and the lower source/drain region 20, with such source/drain regions being gatedly coupled with one another by the transistor gate 80. The interconnects 72, 74 and 75 connect the vertical transistor 82 with components of an integrated circuit. The transistor 82 may be utilized in any suitable applications; and may, for example, be incorporated into memory, logic, sensors, etc.

The transistor 82 may be one of a plurality of substantially identical transistors formed within an integrated circuit (with the term "substantially identical" meaning identical to within reasonable tolerances of fabrication and measurement). For instance, the transistor 82 may be utilized in memory and may be one of hundreds, thousands, millions, etc., of substantially identical transistors extending across a memory array. Example memory applications are described below with reference to FIGS. 17-21.

Referring to FIGS. 9, 9A, 9B and 9C, an example vertical transistor 82 is shown, together with the interconnects 72, 74 and 75. FIGS. 9, 9A, 9B and 9C are provided to assist the reader in understanding the configuration of the example vertical transistor 82 formed with the processing of FIGS. 1-8.

Figure 10:
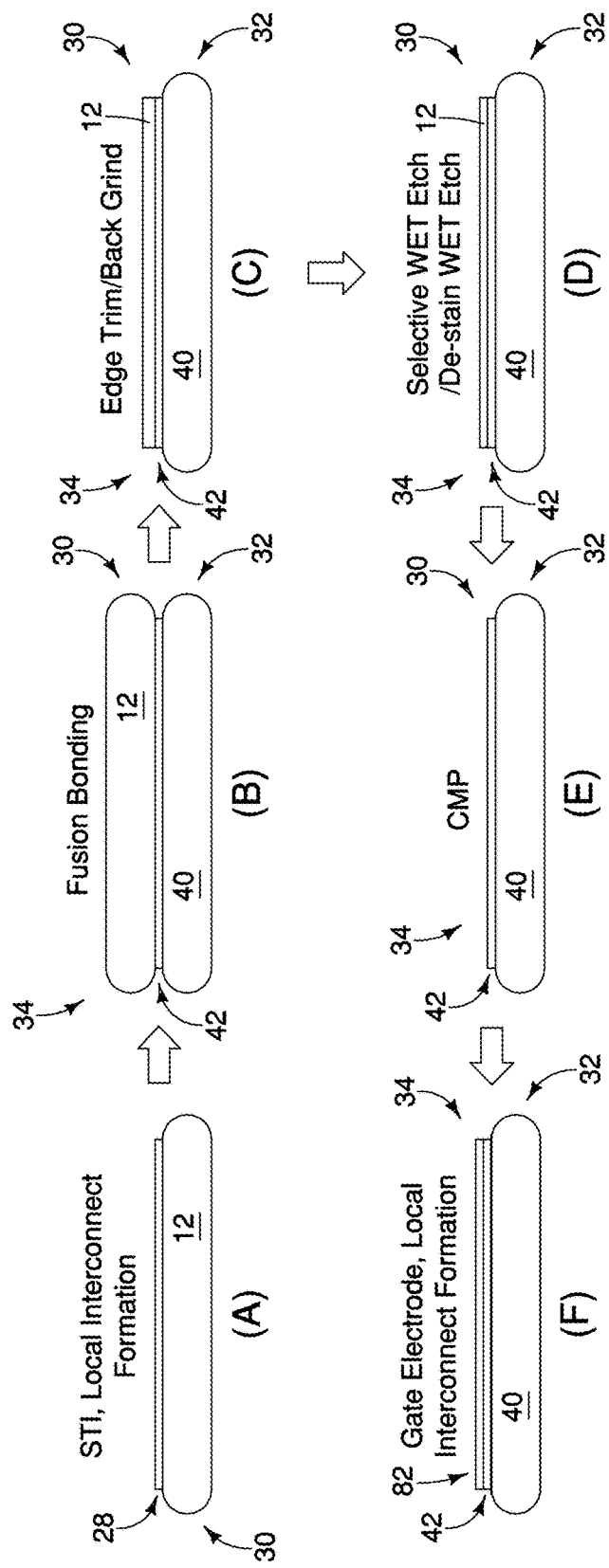
FIG. 10 diagrammatically illustrates example process stages of an example method for fabricating integrated circuitry.

Referring to FIG. 10, such provides an overview of various process steps which may be utilized in the processing of FIGS. 1-8.

An initial processing stage A of FIG. 10 comprises an assembly 30 analogous to that of FIG. 3. The assembly 30 of processing stage A is diagrammatically illustrated to comprise the bonding material 28 over semiconductor material 12, with the assembly 30 being indicated to comprise the STI (16 of FIG. 3). The insulative layer 22, conductive plug 24, and conductive rail 26 of FIG. 3 may also be present, and may be under the dielectric bonding region 28.

The next processing stage B of FIG. 10 comprises fusion bonding of the first assembly 30 with the second assembly 32 to form a hybrid structure 34 analogous to that of FIG. 4. The second assembly 32 may be considered to correspond to a support substrate in some embodiments. The bonding region 42 is diagrammatically illustrated to be between the semiconductor material 12 of assembly 30 and the semiconductor material 40 of assembly 32. The assembly 30 is inverted in processing stage B relative to processing stage A. The next processing stage C of FIG. 10 comprises an edge trim/back grind of the semiconductor material 12.

The next processing stage D of FIG. 10 comprises a selective wet etch/de-stain wet etch of the semiconductor material 12. The selective wet etch may be utilized to selectively remove semiconductor material 12 relative to oxide, such as, for example, the oxide of the STI regions 16 of FIG. 4. The wet etch may utilize any suitable conditions; and in some embodiments may utilize potassium hydroxide (KOH) or tetramethyl ammonium hydroxide (TMAH).

The next step E of FIG. 10 comprises CMP to form a structure analogous to that of FIG. 5. The semiconductor material 12 is not shown relative to the structure of the processing stage E of FIG. 10 due to the scale of the drawings, but would remain present as shown in FIG. 5.

The final step F of FIG. 10 comprises formation of various structures shown in FIG. 8 for fabrication of the transistor 82; including, for example, the gate electrode 80, the interconnects 72 and 74, etc.

Figure 11:
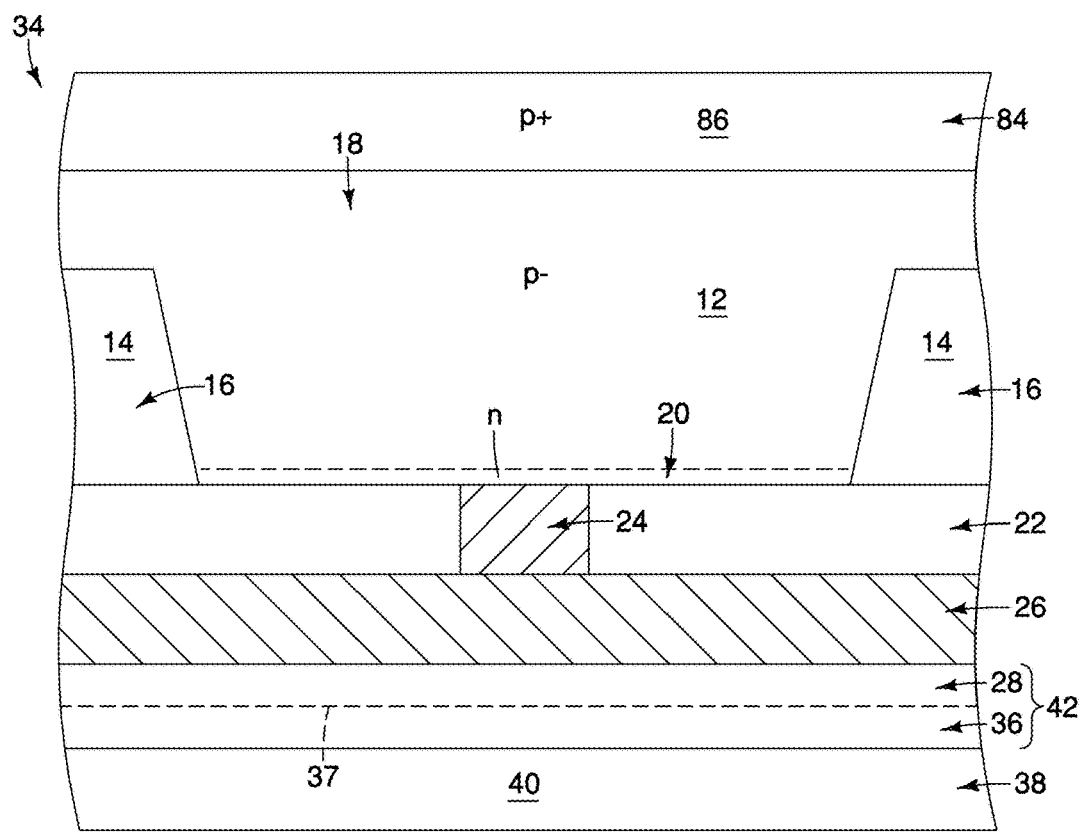
FIGS. 11 and 12 are diagrammatic cross-sectional side views of a structure at example process stages during fabrication of an example vertical transistor; with the process stage of FIG. 11 following that of FIG. 4 in some embodiments.
Figure 12:
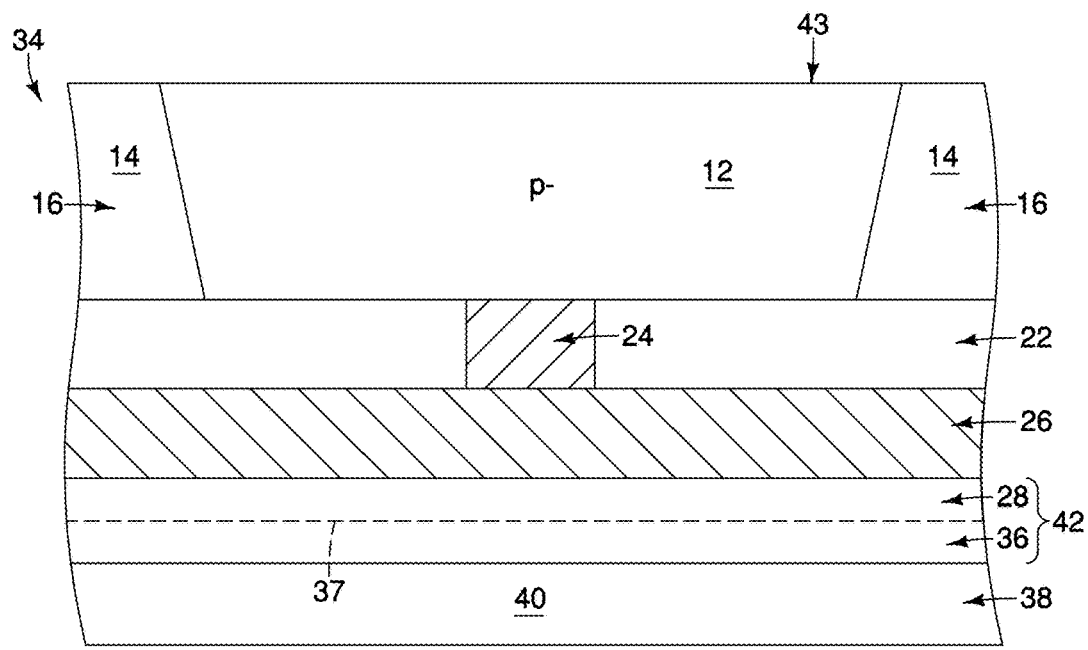

It can be desired that the polishing described with reference to FIG. 5, and with reference to processing stage E of FIG. 10 provide a highly-planarized surface. In some embodiments, a structure may be provided over semiconductor material 12 prior to the polishing; with such structure assisting in achieving the desired highly-planarized surface. FIGS. 11 and 12 illustrate an example of such processing.

FIG. 11 shows the hybrid structure 34 at a processing stage which may follow that of FIG. 4. A structure 84 is provided over the semiconductor material 12, with such structure comprising a material 86. In some embodiments, semiconductor material 12 may comprise monocrystalline silicon, and material 86 may correspond to monocrystalline silicon epitaxially grown relative to the monocrystalline silicon of the semiconductor material 12. The semiconductor material 86 may be epitaxially grown from the semiconductor material 12 in some embodiments; and in other embodiments the semiconductor material 12 may be epitaxially grown from material 86. For instance, the semiconductor material 12 may be grown over the semiconductor material 86 at a processing stage prior to that of FIG. 1.

The semiconductor material 86 may be referred to as third semiconductor material to distinguish it from the first and second semiconductor materials 12 and 40.

The semiconductor material 86 may be undoped (i.e., any dopant present is present to a concentration of less than or equal to about $10^{15}$ atoms/cm$^3$), or may be doped; and in the shown embodiment is doped to a p+ level. The p-type doping within the semiconductor material 86 may be accomplished by, for example, providing boron within the semiconductor material 86. After the protective structure 84 is provided over material 12, the structure 34 may be subjected to the processing described with reference to structures D and E of FIG. 10 (i.e., wet etch/de-stain wet etch and CMP), to form the hybrid structure 34 of FIG. 12 having a highly-planarized surface 43.

Figure 13:
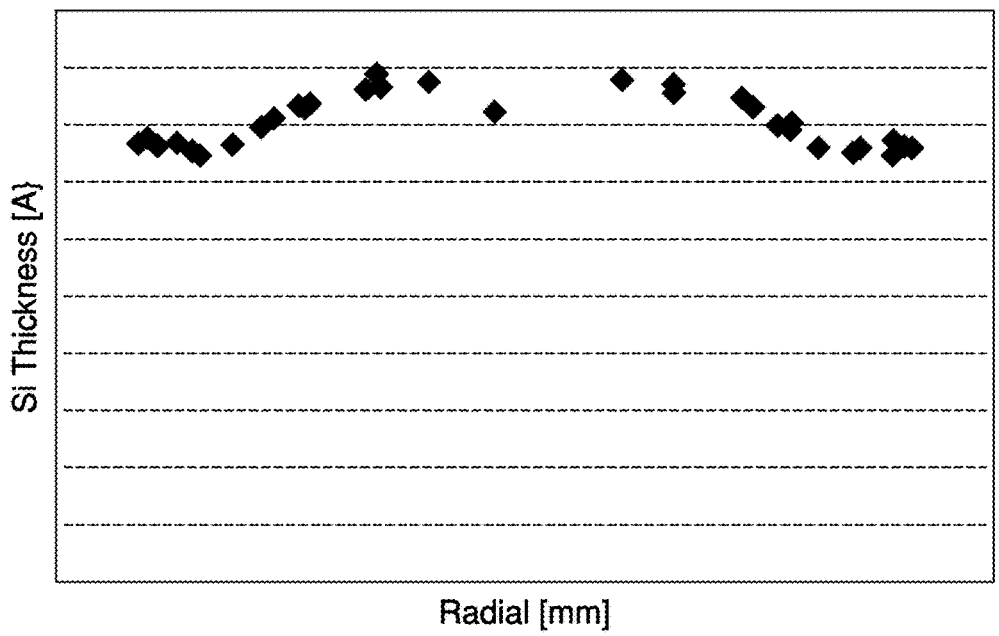
FIGS. 13 and 14 are graphs of silicon substrate thickness (Si Thickness), in Angstroms, versus radial position (in millimeters), and show example thickness variation across the substrates after example polishing procedures.
Figure 14:
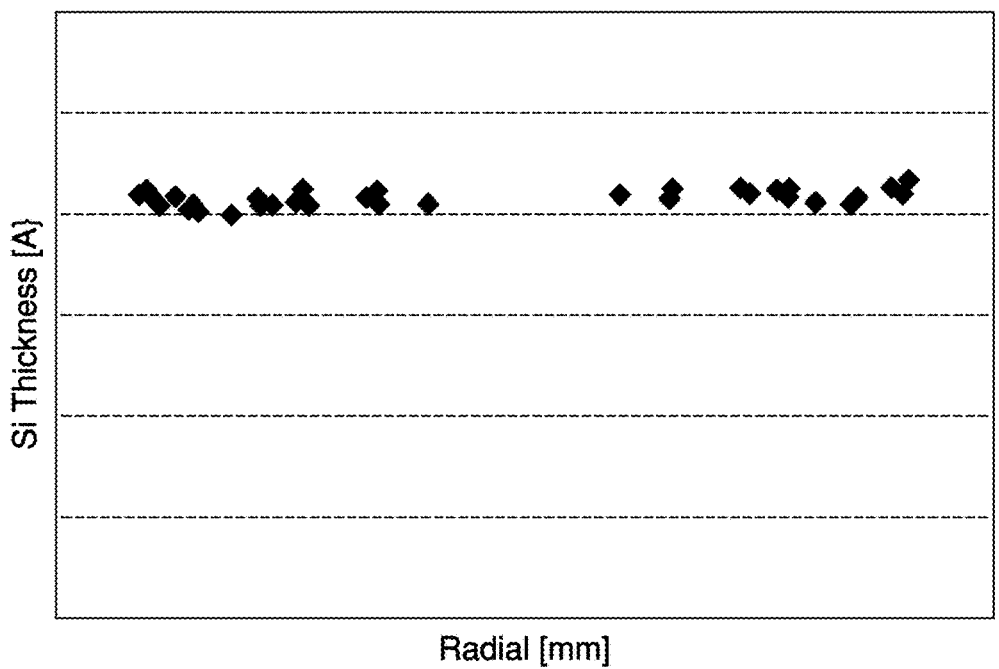

Example levels of surface planarity achievable with the processing of FIGS. 11 and 12 is described with reference to FIGS. 13 and 14. FIG. 13 graphically illustrates the surface planarity after the wet etch (e.g., the etching described with reference to structure D of FIG. 10), and FIG. 14 graphically illustrates the surface planarity after the chemical mechanical polishing (e.g., the CMP described with reference to structure E of FIG. 10). The surface planarity achieved after the wet etching may include roughness (surface variation) of less than or equal to about 2000 Å, and the surface planarity achieved after the CMP may include roughness (surface variation) of less than or equal to about 200 Å.

Figure 15:
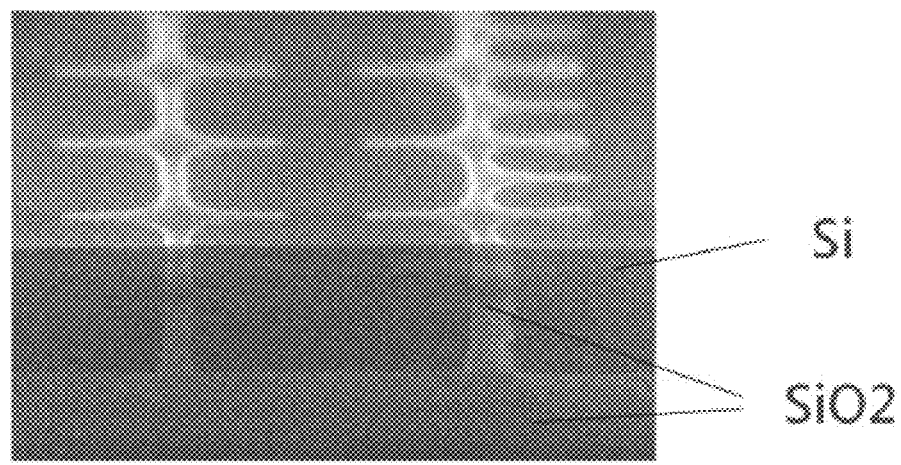
FIG. 15 is photographic cross-section through an example substrate.
Figure 16:
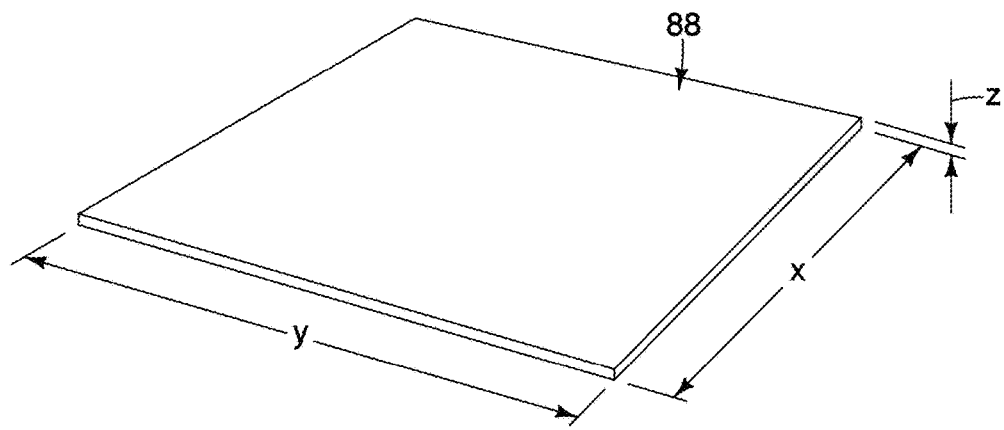
FIG. 16 is a three-dimensional view of the example substrate diagrammatically illustrating that the substrate may have a small step height after example polishing procedures.

FIGS. 15 and 16 further illustrate the high-planarity achievable utilizing processing of the type described with reference to FIGS. 11 and 12. FIG. 15 is a photograph of a structure having silicon (Si) and silicon dioxide (SiO2), with the silicon having a highly-planarized upper surface formed utilizing processing of the type described herein. FIG. 16 diagrammatically illustrates a silicon-containing structure 88 and three-dimensional view, with such structure having a step height after CMP (i.e., a variation in distance "z") of less than about 100 Å.

Figure 17:
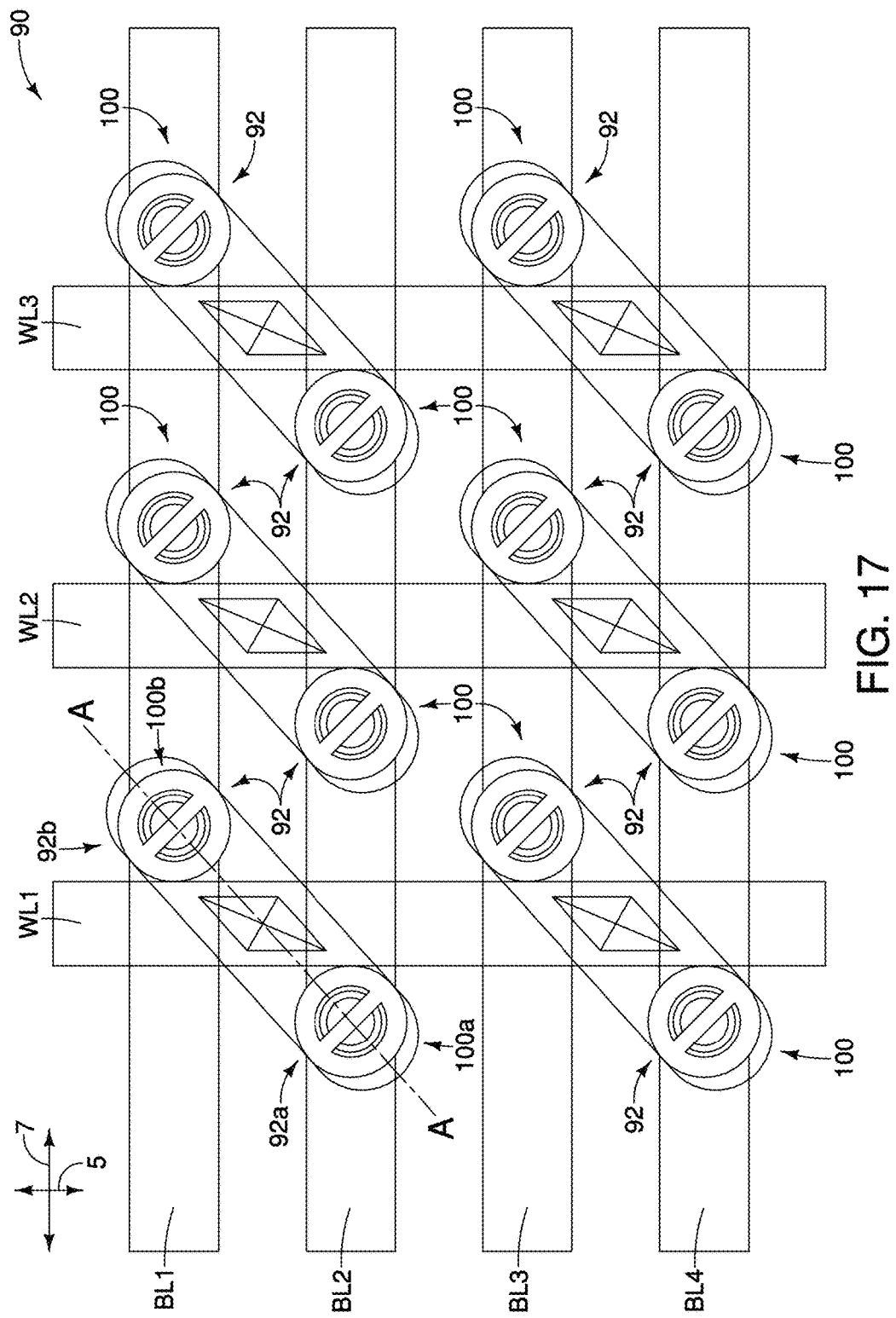
FIG. 17 shows a top view of an assembly comprising an example DRAM embodiment.
Figure 18:
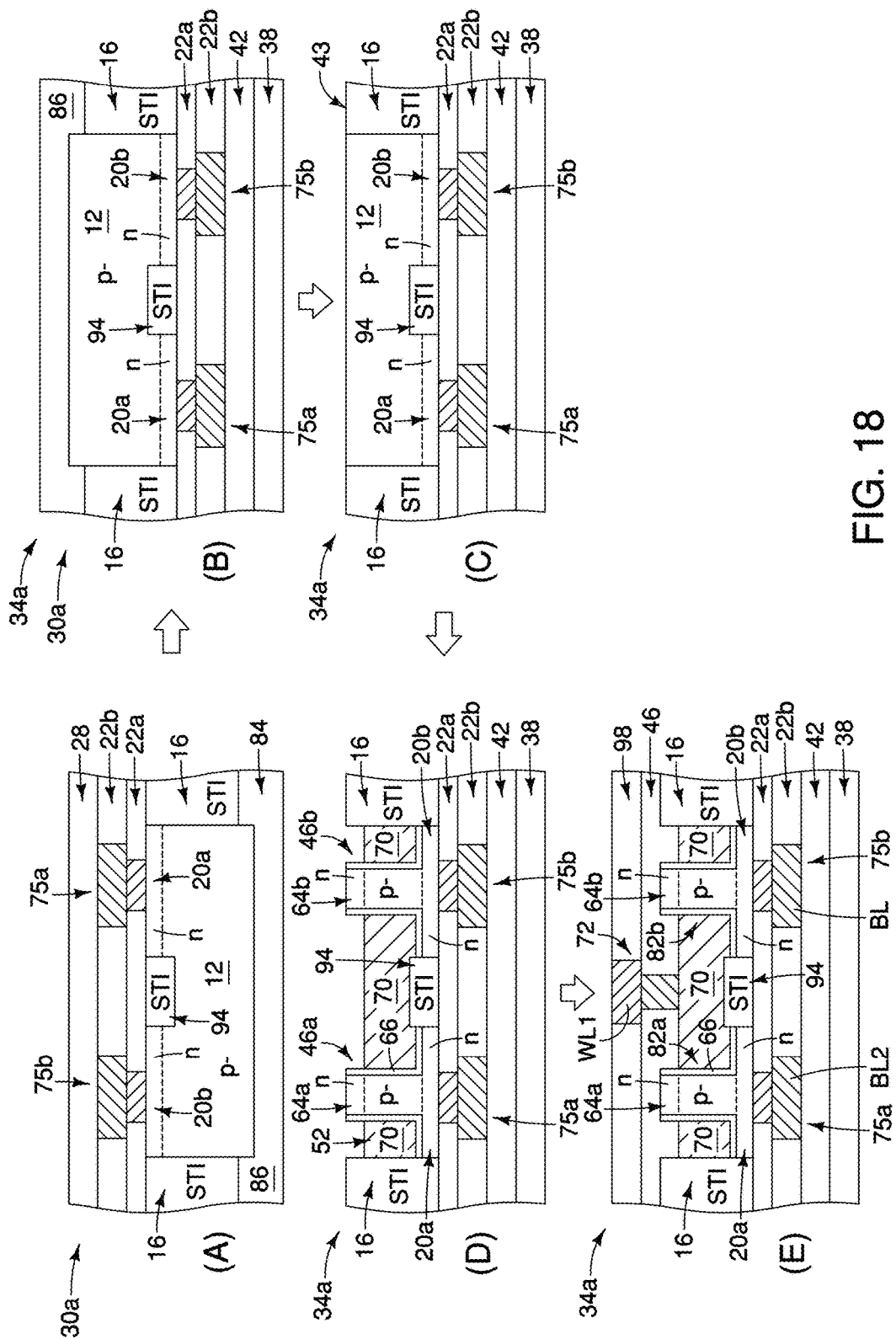
FIG. 18 shows diagrammatic cross-sectional side views of an example assembly at example process stages during fabrication of the example DRAM embodiment of FIGS. 17 and 17A.

In some embodiments, the processing described above with reference to FIGS. 1-16 be utilized to fabricate the memory cells of memory arrays. FIGS. 17 and 18 describe an example DRAM array, and example processing utilized to fabricate memory cells of the DRAM array.

Referring to FIG. 17, a region of an example DRAM array 90 is illustrated, with such array comprising a plurality of memory cells 92. Wordlines WL1, WL2 and WL3 extend across the memory array along a first direction represented by an axis 5; and bitlines (i.e., digit lines) BL1, BL2, BL3 and BL4 extend across the memory array along a second direction represented by an axis 7. Each of the memory cells 92 is uniquely addressed utilizing the combination of a wordline and a bitline. In the illustrated embodiment, wordlines are shared between neighboring memory cells. A pair of the memory cells are labeled 92a and 92b so that they may be distinguished from the other memory cells.

Figure 17A:
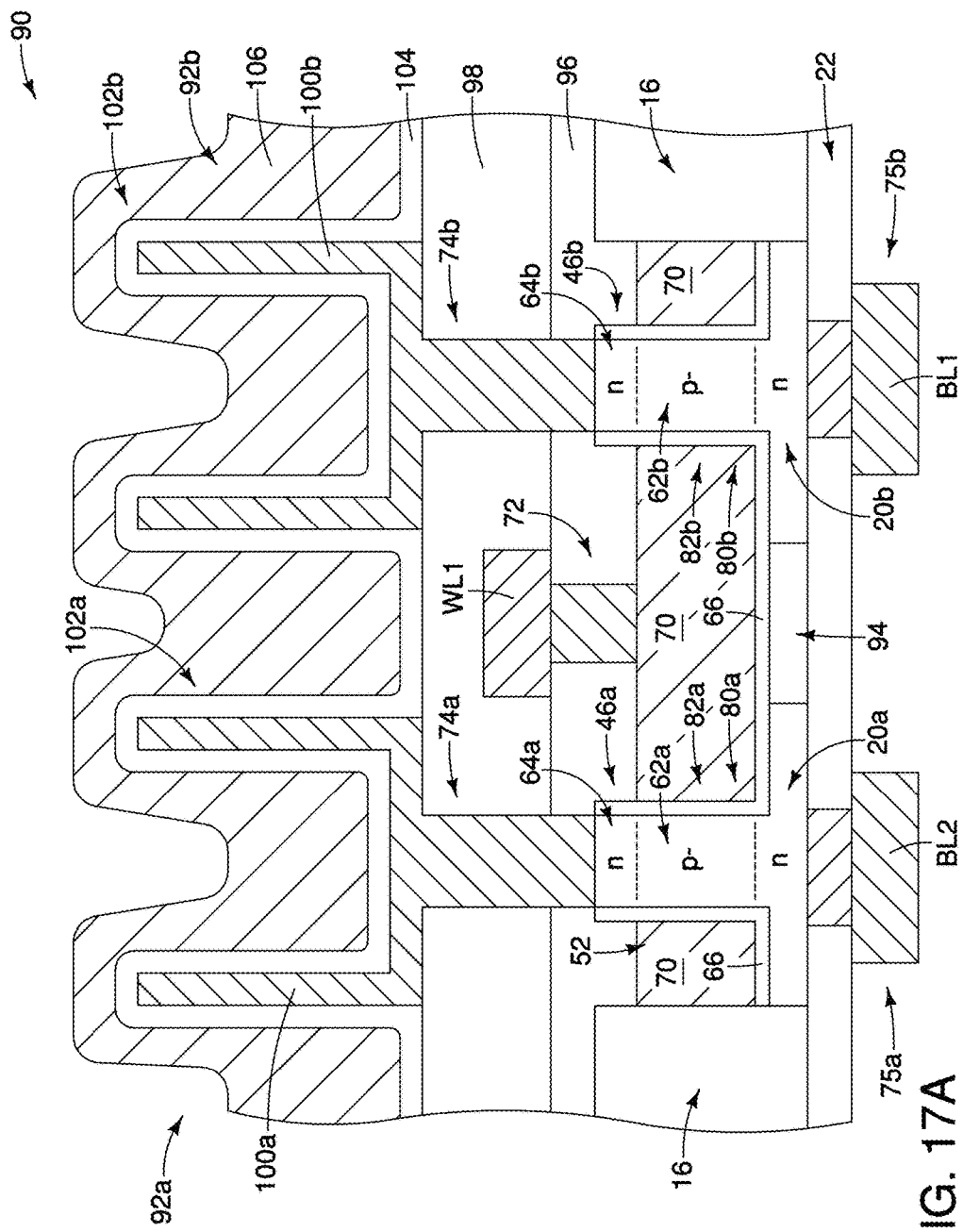
FIG. 17A is a cross-sectional view along the line A-A of FIG. 17.

FIG. 17A shows a cross-section along the line A-A of FIG. 17, and specifically shows a cross-section through the memory cells 92a and 92b. In some embodiments, the memory cells 92a and 92b may be referred to as first and second DRAM cells, respectively.

The memory cells 92a and 92b comprise vertical transistors 82a and 82b, respectively; with such vertical transistors being analogous to the vertical transistor 82 described above with reference to FIG. 8. In some embodiments, vertical transistors 82a and 82b may be referred to as first and second vertical transistors, respectively.

The first and second vertical transistors 82a and 82b comprise first and second pillars 46b and 46b, respectively; and include lower source/drain regions (20a, 20b), upper source/drain regions (64a, 64b), and channel regions (62a, 62b) between the upper and lower source/drain regions. Also, the vertical transistors 82a and 82b comprise transistor gates 80a and 80b, respectively; with such transistor gates comprising conductive gate material 70. In some embodiments, the source/drain regions 20a, 64a, 20b and 64b may be referred to as first, second, third and fourth source/drain regions, respectively.

The memory cells 92a and 92b are neighboring to one another, and comprise pillars 46b and 46b which are formed in a common tub 52 as one another. The lower source/drain regions 20a and 20b are isolated from one another by an insulative block 94. Such block may comprise any suitable composition or combination of compositions; and in some embodiments may comprise, consist essentially of, or consist of silicon dioxide. Conductive interconnects 75a and 75b electrically couple the lower source/drain regions 20a and 20b with the bitlines BL1 and BL2, respectively.

A shared interconnect 72 electrically couples the transistor gates 80a and 80b with the wordline WL1. In the shown embodiment, insulative materials 96 and 98 are over the gate material 70 and surround the wordline WL1. The insulative materials 96 and 98 may comprise any suitable composition(s); and may, for example, comprise, consist essentially of, or consist of silicon dioxide, silicon nitride, etc. The insulative materials 96 and 98 may be the same composition as one another in some embodiments, and may be different compositions relative to one another in other embodiments.

In the illustrated embodiment, the upper source/drain regions 64a and 64b are electrically coupled with storage nodes (i.e., lower nodes) 100a and 100b of capacitors 102a and 102b, respectively, through interconnects 74a and 74b. The capacitors additionally comprise capacitor dielectric material 104 over the lower nodes 100a and 100b; and comprise an upper node (i.e. plate electrode) 106 over the capacitor dielectric material 104. The capacitor dielectric material 104 may comprise any suitable composition or combination of compositions; and in some embodiments may comprise one or both of silicon dioxide and silicon nitride. The lower electrodes (i.e., storage nodes) 100a, 100b and plate electrode 106 may comprise any suitable composition or combination of compositions; and in some embodiments may comprise conductively-doped semiconductor material and/or metal. The capacitor storage nodes 100 are diagrammatically illustrated in FIG. 17; and the dielectric material 104 and plate electrode 106 are not shown in the view of FIG. 17 in order to simplify the drawing.

FIG. 18 illustrates an example process for fabricating the memory array 90, and specifically illustrates such process with reference to a region comprising the memory cells 92a, 92b (not labeled in FIG. 18, but shown and described in FIGS. 17 and 17A). The process of FIG. 18 begins with a processing stage A comprising an assembly 30a analogous to the assembly 30 of FIG. 3. However, the assembly 30a includes the insulative block 94 extending through the doped region 20 to subdivide the doped region into regions 20a and 20b. Additionally, the assembly 30a includes conductive materials corresponding to the interconnects 75a and 75b. The interconnects 75a, 75b extend within insulative materials 22a and 22b. The dielectric bonding material 28 is formed over the interconnects 75a, 75b. Additionally, the semiconductor material 86 described above with reference to FIG. 11 is shown to be provided against semiconductor material 12.

The processing stage B of FIG. 18 is analogous to the stage described above with reference to FIG. 4, and comprises a hybrid structure 34a having assembly 30a inverted and bonded to a support structure 38 through a bonding region 42.

The processing stage C shows hybrid structure 34a after formation of a planarized upper surface 43 analogous to that described above with reference to FIGS. 5 and 12.

The processing stage D shows hybrid structure 34a at a processing stage analogous to that of FIG. 7; and specifically shows the hybrid structure 34a after patterning of the first pillar 46b on one side of the insulative block 94, and the patterning of the second pillar 46b on the other side of the block 94. Both of the pillars 46b and 46b are within a tub 52 analogous to the tub described above with reference to FIG. 6. The dielectric material 66 is formed along sidewalls of the pillars 46a, 46b, and along a bottom of the tub 52. The conductive gate material 70 is formed over the dielectric material 66. Additionally, the conductively-doped source/drain regions 64a and 64b are formed along the upper portions of the pillars 46b and 46b.

The processing stage E shows the hybrid structure 34a after formation of insulative materials 96 and 98, and the interconnect 72. The construction 34a at the processing stage E is analogous to the construction shown in FIG. 17A, but lacks the capacitors 102a and 102b. Such capacitors may be formed with any suitable subsequent processing.

Figure 19:
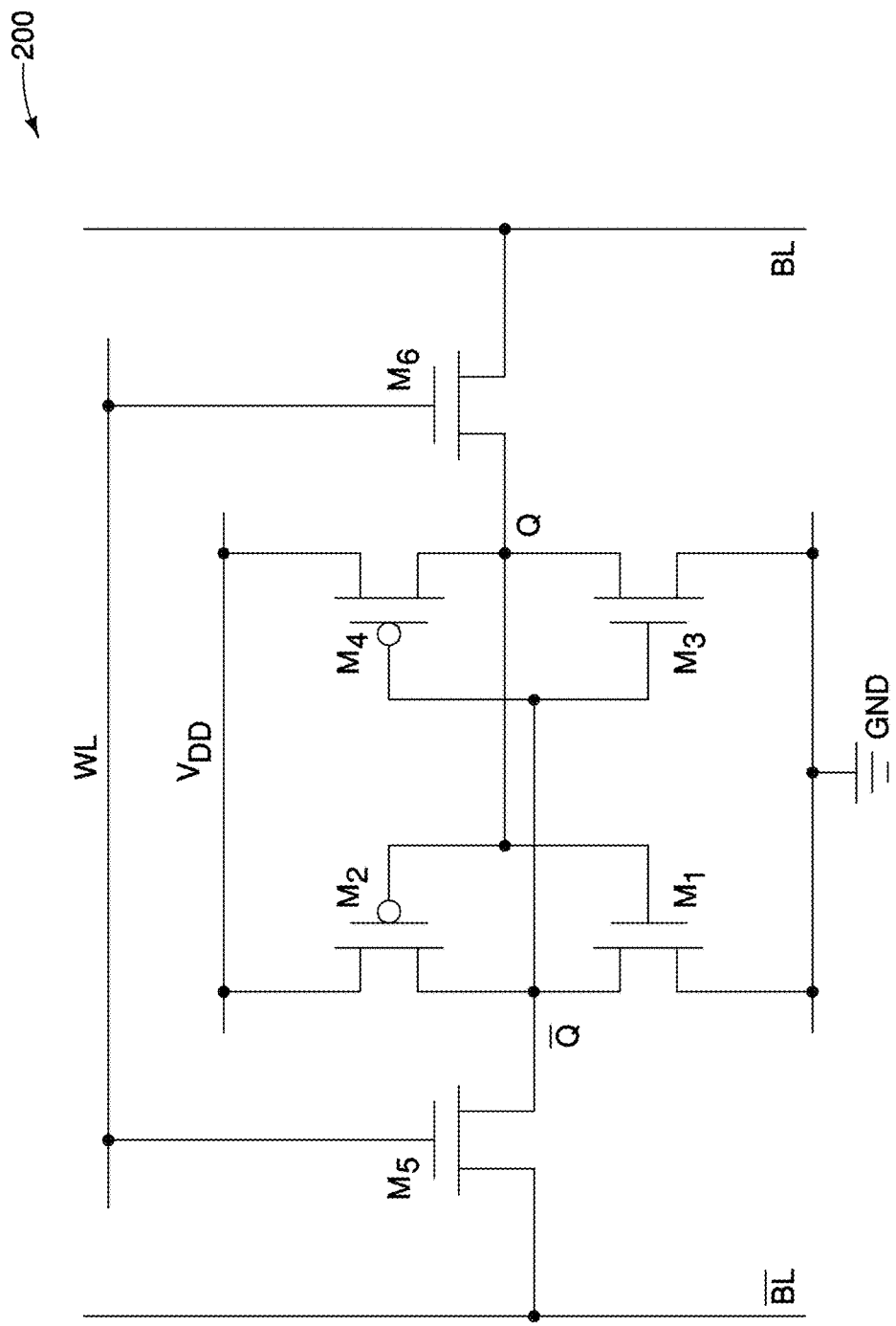
FIG. 19 is a circuit schematic of a static memory cell.

In some embodiments, the processing described herein may be utilized to fabricate memory cells of an SRAM array. FIG. 19 schematically illustrates an example SRAM memory cell 200. The memory cell comprises six transistors M1, M2, M3, M4, M5 and M6; with the transistors M2 and M4 being p-channel devices and the remaining transistors being n-channel devices. The transistors M5 and M6 correspond to access transistors. The transistors M1 and M2 are a first driver transistor (e.g. pulldown transistor) and a first load transistor (e.g. pullup transistor), respectively, of a first inverter; and the transistors M3 and M4 are a second driver transistor and a second load transistor, respectively, of a second inverter. The first and second inverters are cross-coupled with one another to form a bi-stable flip-flop. A wordline WL is electrically coupled with gates of the access transistors M5 and M6. First and second comparative bitlines BL and BL are coupled with terminals of the access transistors M5 and M6. The comparative bitlines may extend to circuitry (not shown) utilized for read/write operations associated with the memory cell 200 (such circuitry may comprise any suitable components, including, for example, logic, CMOS, a sense amplifier, drivers, etc.). The p-channel transistors M2, M4 have source/drain regions coupled with a first reference voltage (illustrated as VDD), and the n-channel transistors M1, M3 have source/drain regions coupled with a second reference voltage (illustrated as ground, GND); with the second reference voltage being less than the first reference voltage.

Figure 20:
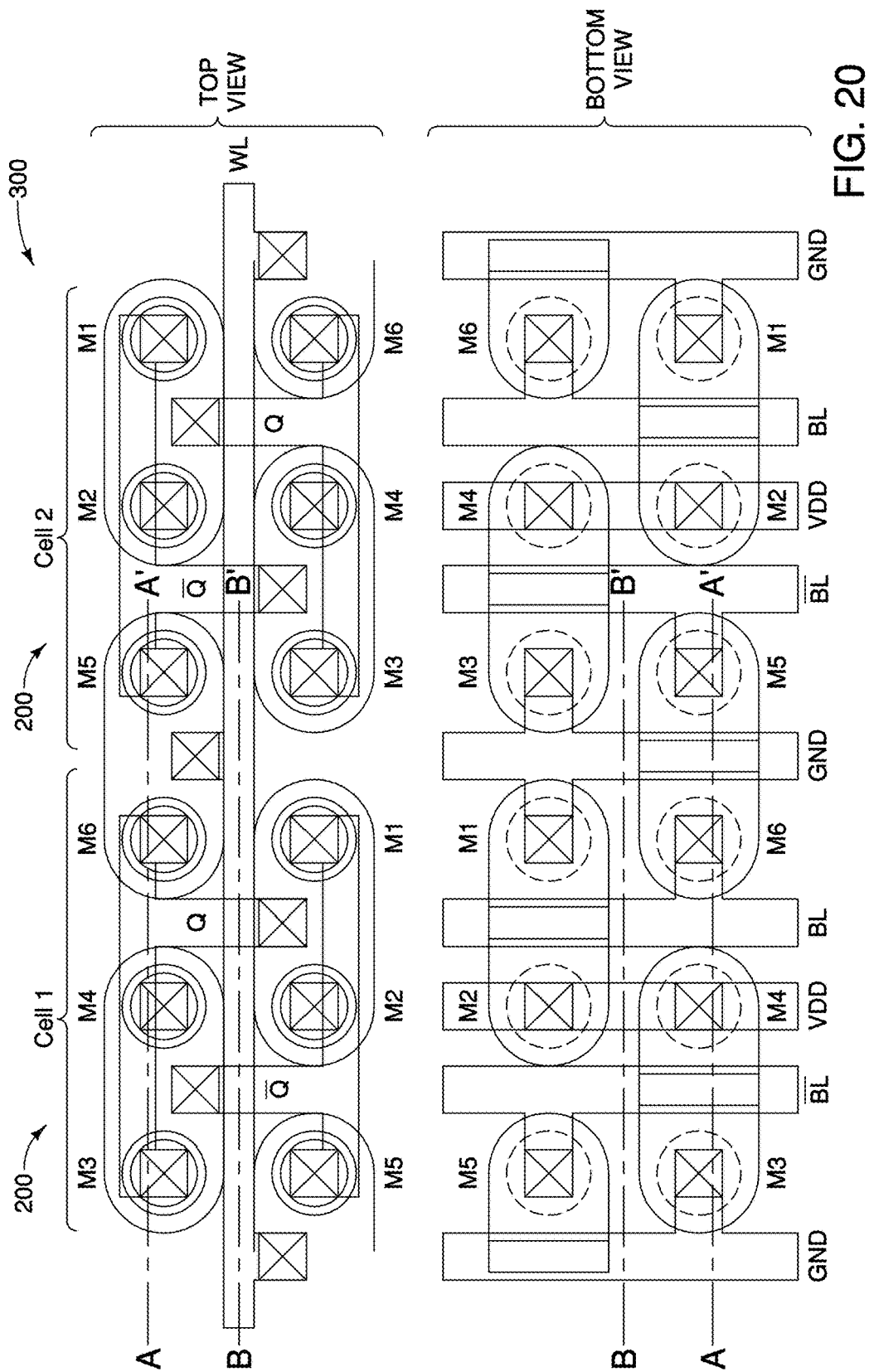
FIG. 20 shows a top view and a bottom view of an assembly comprising an example SRAM embodiment.

FIGS. 20, 20A and 20B illustrate a region of a memory array 300 comprising a pair of adjacent SRAM cells 200, which are identified as Cell 1 and Cell 2. Various components of the cells 200 are identified with the labels utilized in FIG. 19. The cross-sectional views of FIGS. 20A and 20B show that the transistors of the SRAM cells may be formed utilizing processing of the type described above with reference to FIGS. 1-16. The configurations of FIGS. 20A and 20B may be hybrid structures comprising a bonding region 42 and underlying semiconductor substrate 38 as described above with reference to FIG. 4, but the bonding region 42 and underlying substrate 38 not shown in order to simplify the drawings.

FIG. 20A shows that driver transistor M3 and load transistor M4 may be vertical transistors having pillars extending within a common tub 52a, and that the access transistors M5 and M6 may be vertical transistors having pillars extending within a common tub 52b. Bottom source/drain regions of the paired transistors within the common tubs are isolated from one another with insulative blocks 94 analogous to the block 94 described above with reference to FIGS. 17A and 18.

A ground connection 210 is coupled with a bottom source/drain region of the M3 transistor, a VDD connection 212 is coupled with the bottom source/drain region of the M4 transistor, a bitline connection 214 is coupled with the bottom source/drain region of the M6 transistor, a bitline connection 216 is coupled with the bottom source/drain region of the transistor M5, a region of a bitline connection 211 is along the cross-section of FIG. 20A, and a region of a ground connection 215 is also along the cross-section of FIG. 20A.

The paired transistors M3/M4 and M6/M5 of FIG. 20A may be formed with processing analogous to that described above with reference to FIG. 18, with example processing being described with reference to FIG. 21; and being specifically described relative to fabrication of a region comprising the paired driver and load transistors M3, M4.

Figure 21:
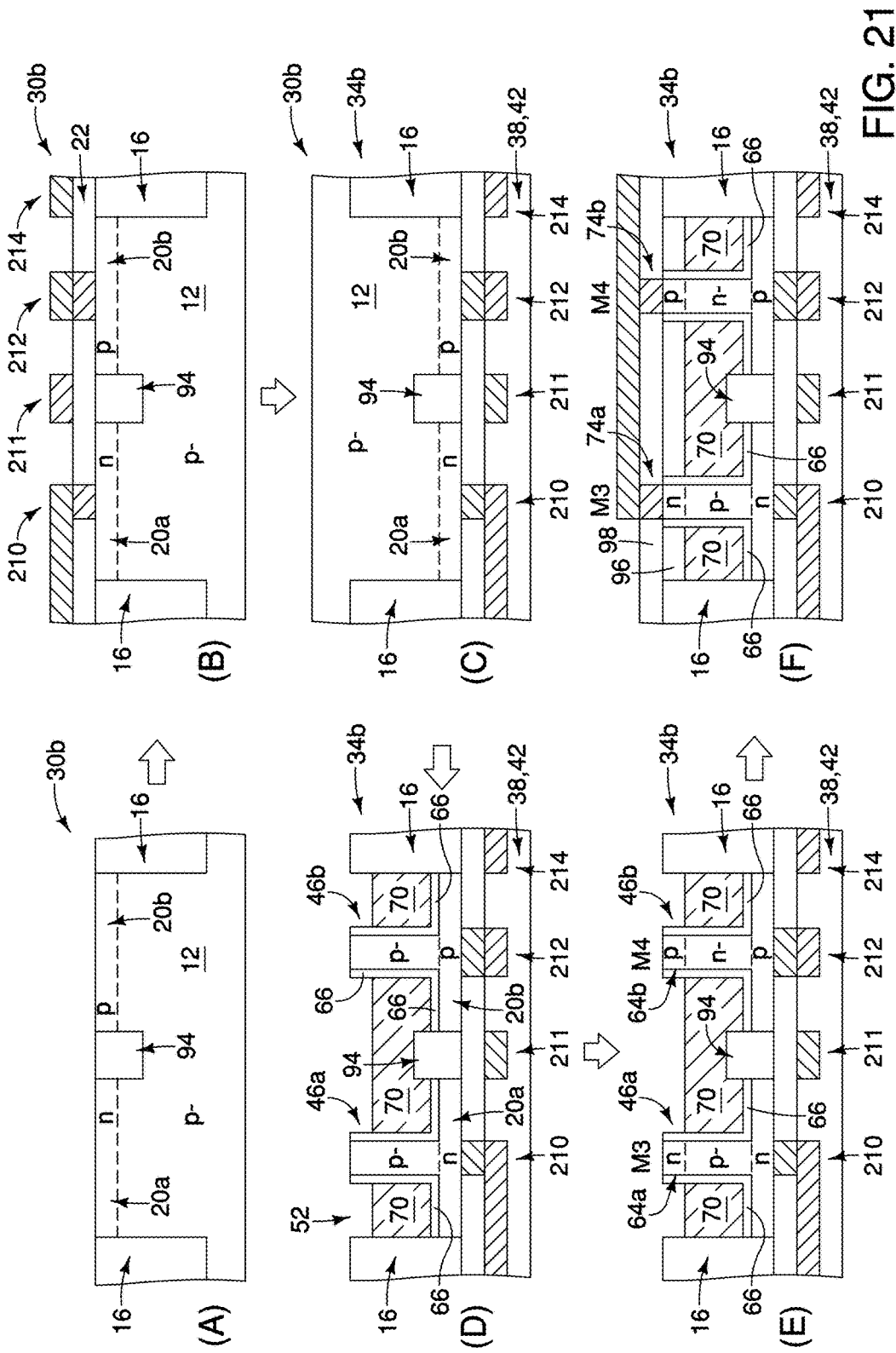
FIG. 21 shows diagrammatic cross-sectional side views of an example assembly at example process stages during fabrication of the example SRAM embodiment of FIGS. 20, 20A, and 20B.

The process of FIG. 21 begins with a processing stage A comprising an assembly 30b which includes the insulative block 94 extending through the doped region 20 to subdivide the doped region into regions 20a and 20b. Further the region 20a is n-type and the adjacent region 20b is p-type.

The processing stage B of FIG. 21 shows assembly 30b comprising an insulative layer 22 formed over the doped regions 20a, 20b; and comprising connections 210, 211, 212 and 214.

The processing stage C of FIG. 20 is analogous to the stage described above with reference to FIG. 4, and comprises a hybrid structure 34b having assembly 30b inverted and bonded to a support structure 38 through a bonding region 42 (with the structure 38 and bonding region 42 being shown together as a region 38, 42 to simplify the drawing).

The processing stage D shows hybrid structure 34b at a processing stage analogous to that of FIG. 7; and specifically shows the hybrid structure 34b after patterning of a first pillar 46b on one side of the insulative block 94, and the patterning of a second pillar 46b on the other side of the block 94. Both of the pillars 46b and 46b are within a tub 52 analogous to the tub described above with reference to FIG. 6. The dielectric material 66 is formed along sidewalls of the pillars 46a, 46b, and along a bottom of the tub 52. The conductive gate material 70 is formed over the dielectric material 66. A segment of the n-type region 20a becomes a lower source/drain region at a bottom of pedestal 46a, and a segment of the p-type region 20b becomes a lower source/drain region at a bottom of pedestal 46b. In some embodiments, the source/drain region at the bottom of pedestal 46a may be referred to as a first source/drain region, and the source/drain region at the bottom of pedestal 46b may be referred to as a third source/drain region.

The processing stage E shows the hybrid structure 34b after a section of pillar 46b is counter-doped to become an n-type channel region (and in the shown embodiment is doped to an n− dopant level); and after upper source/drain regions 64a and 64b are formed within top portions of the pedestals 46b and 46b. The source/drain regions 64a and 64b may be referred to as a second source/drain region and a fourth source/drain region, respectively. The dopant levels and types within the pedestals 46b and 46b form the n-channel transistor (driver transistor) M3 from pedestal 46a, and form the p-channel transistor (load transistor) M4 from pedestal 46b.

The processing stage F shows the hybrid structure 34b after formation of insulative materials 96 and 98, and the interconnects 74a and 74b. The construction 34b at the processing stage F corresponds to a region of the SRAM array shown in FIGS. 20, 20A and 20B. Other regions of the SRAM array may be formed simultaneously with the M3 and M4 transistors of FIG. 21.

The memory arrays and structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming integrated circuitry. A structure is formed to have a first semiconductor material over a dielectric bonding region, a second semiconductor material under the dielectric bonding region, an insulative wall laterally surrounding a volume of the first semiconductor material, and a first doped region along a lower surface of the first semiconductor material. The volume of the first semiconductor material is patterned to form a pillar within a tub. The pillar extends upwardly from a first area of the first doped region. A bottom of the tub is along a second area of the first doped region within said volume. The pillar has a bottom portion and a top portion. The first area of the first doped region is a lower doped region within the pillar. An upper doped region is within the top portion of the pillar. A dielectric liner is formed to extend along a sidewall of the pillar, and to extend over the second area of the first doped region along the bottom of the tub. Conductive gate material is formed within the tub and over the dielectric liner. The lower and upper doped regions comprise first and second source/drain regions, respectively, and the conductive gate material comprises a transistor gate. The first and second source/drain regions are gatedly coupled to one another by the transistor gate.

Some embodiments include a method of forming integrated circuitry. A hybrid structure is formed to comprise an upper structure over a dielectric bonding region, and a lower structure under the dielectric bonding region. The upper structure has a first semiconductor material, an insulative periphery laterally surrounding the first semiconductor material, and a lower doped region along a lower surface of the first semiconductor material. The lower structure has a second semiconductor material. A first portion of the first semiconductor material is patterned into a pair of neighboring pillars. A remaining second portion of the first semiconductor material is recessed relative said first portion. Each of the pillars has a bottom portion and a top portion, with the bottom portion including a segment of the lower doped region. The pillars are a first pillar and a second pillar. Upper doped regions are formed within the top portions of the pillars. A dielectric liner is formed to extend along sidewalls of the pillars, and to extend along said remaining second portion of the first semiconductor material. Conductive gate material is formed along the dielectric liner and within a container bounded by the insulative periphery. The lower and upper doped regions within the first pillar comprise first and second source/drain regions, respectively, and the conductive gate material comprises a first transistor gate which gatedly couples the first and second source/drain regions to one another. The lower and upper doped regions within the second pillar comprise third and fourth source/drain regions, respectively, and the conductive gate material comprises a second transistor gate which gatedly couples the third and fourth source/drain regions to one another.

Some embodiments include a method of forming integrated circuitry. A first assembly is formed to have an insulative boundary structure laterally surrounding a region of a first semiconductor material, a first doped region along an upper surface of the first semiconductor material, an insulative layer over the first doped region, a conductive plug extending through the insulative layer and coupled with the first doped region, a conductive rail over the insulative layer and coupled with the conductive plug, and a first bonding dielectric material over the conductive rail. A second assembly is formed to have a second bonding dielectric material over a second semiconductor material. The first and second bonding dielectric materials are joined to one another to form a hybrid structure comprising the first and second assemblies. The hybrid structure is provided in an orientation with the first assembly being inverted so that the first doped region is now along a lower region of the first semiconductor material. The region of the first semiconductor material is patterned to form a pillar within a tub. The pillar extends upwardly from a first area of the first doped region. A bottom of the tub is along a second area the first doped region. The pillar has a bottom portion and a top portion. A second doped region is formed within the top portion of the pillar. A dielectric liner is formed to extend along a sidewall of the pillar, and to extend over the first doped region along the bottom of the tub. Conductive gate material is formed within the tub and over the dielectric liner. The first and second doped regions comprise first and second source/drain regions, respectively, and the conductive gate material comprises a transistor gate. The first and second source/drain regions are gatedly coupled to one another by the transistor gate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A device comprising:
   an upper structure;
   a lower structure; and
   bonding dielectric material between the upper and lower structures to bond the upper and lower structures to each other;
   wherein the upper structure comprises:
      first semiconductor material including first and second main surfaces opposing to each other;
      a semiconductor pillar protruding from a first part of the first main surface of the first semiconductor material, the semiconductor pillar including an upper surface and a side surface extending downwardly from the upper surface;
      gate conductive material over a second part of the first main surface of the first semiconductor material around the first part of the first main surface to surround the side surface of the semiconductor pillar;
      gate dielectric material between the gate conductive material and each of the side surface of the semiconductor pillar and the second part of the first main surface of the first semiconductor material;
      first electrode material in electrical contact with at least a part of the upper surface of the semiconductor pillar;
      second electrode material in electrical contact with at least a part of an upper surface of the gate conductive material; and
      third electrode material in electrical contact with at least a part of the second main surface of the first semiconductor material; and
   wherein the lower structure comprises second semiconductor material.

2. The device of claim 1 wherein:
an upper source/drain region is within an upper part of the semiconductor pillar and includes the upper surface of the semiconductor pillar;
a lower source/drain region is within a lower part of the first semiconductor material and includes the second main surface of the first semiconductor material;
a channel region is vertically between the upper and lower source/drain regions; and
the gate conductive material is along the channel region.

3. The device of claim 2 wherein the channel region is within an upper part of the first semiconductor material and includes the first main surface of the first semiconductor material.

4. The device of claim 1 wherein the third electrode material is coupled with a conductive rail which is over the bonding dielectric material.

5. The device of claim 4 wherein the first semiconductor material is over an insulative layer, wherein the third electrode extends through the insulative layer;
and wherein the conductive rail is under the insulative layer.

6. The device of claim 1 wherein the bonding dielectric material comprises silicon dioxide.

7. A device comprising:
an insulative layer having an upper surface and a lower surface;
a first semiconductor material over a first region of the upper surface of the insulative layer, and a second semiconductor material over a second region of the upper surface of the insulative layer; the second region being laterally offset from the first region;
an insulative block laterally between the first and second semiconductor materials;
the first semiconductor material having a first main surface, and the second semiconductor material having a second main surface laterally offset from the first main surface;
a first semiconductor pillar protruding upwardly from the first main surface;
a second semiconductor pillar protruding upwardly from the second main surface;
a first capacitor storage node coupled with an upper surface of the first semiconductor pillar;
a second capacitor storage node coupled with an upper surface of the second semiconductor pillar;
a gate conductive material over portions of the first and second main surfaces, over the insulative block, and along side surfaces of the first and second semiconductor pillars;
a gate dielectric material between the gate conductive material and the side surfaces of the first and second semiconductor pillars, and between the gate conductive material and the portions of the first and second main surfaces;
a first bitline under the lower surface of the insulative layer and coupled with a lower surface of the first semiconductor material through a first interconnect that extends through the insulative layer;
a second bitline under the lower surface of the insulative layer and coupled with a lower surface of the second semiconductor material through a second interconnect that extends through the insulative layer;
a wordline coupled with an upper surface of the gate conductive material;
capacitor dielectric material extending across the first and second capacitor storage nodes; and
a plate electrode extending across the first and second capacitor storage nodes, and spaced from the first and second capacitor storage nodes by the capacitor dielectric material.

8. The device of claim 7 wherein:
upper source/drain regions are within upper parts of the first and second semiconductor pillars and include the upper surfaces of the first and second semiconductor pillars;
lower source/drain regions are within lower parts of the first and second semiconductor materials and include the first and second main surfaces;
channel regions are vertically between the upper and lower source/drain regions; and
the gate conductive material is along the channel regions.

9. The device of claim 8 wherein the upper and lower source/drain regions are n-type regions.

10. The device of claim 7 wherein the wordline is beneath regions of the first and second capacitor storage nodes.

11. The device of claim 10 wherein the wordline above the upper surfaces of the first and second semiconductor pillars.

12. The device of claim 7 wherein the insulative layer and the insulative block both comprise a same composition.

13. The device of claim 7 wherein the insulative layer and the insulative block both comprise silicon dioxide.

14. A device comprising:
an insulative layer having an upper surface and a lower surface;
a first semiconductor material over a first region of the upper surface of the insulative layer, and a second semiconductor material over a second region of the upper surface of the insulative layer; the second region being laterally offset from the first region;
an insulative block laterally between the first and second semiconductor materials;
the first semiconductor material having a first main surface, and the second semiconductor material having a second main surface laterally offset from the first main surface;
a first semiconductor pillar protruding upwardly from the first main surface;
a second semiconductor pillar protruding upwardly from the second main surface;
a conductive structure coupled with upper surfaces of the first and second semiconductor pillars;
a gate conductive material over portions of the first and second main surfaces, over the insulative block, and along side surfaces of the first and second semiconductor pillars;
a gate dielectric material between the gate conductive material and the side surfaces of the first and second semiconductor pillars, and between the gate conductive material and the portions of the first and second main surfaces;
a first reference voltage coupled with a lower surface of the first semiconductor material through a first interconnect that extends through the insulative layer;
a second reference voltage coupled with a lower surface of the second semiconductor material through a second interconnect that extends through the insulative layer, with the second reference voltage being different from the first reference voltage; and
one of the first and second semiconductor pillars comprising source/drain regions of a pullup transistor and the other of the first and second semiconductor pillars comprising source/drain regions of a pulldown transistor.

15. The device of claim 14 wherein the pullup transistor and pulldown transistor are together comprised by an inverter.

16. The device of claim 15 including an SRAM cell, and wherein the inverter is one of a pair of inverters within the SRAM cell.

17. The device of claim 14 wherein the first semiconductor pillar comprises the source/drain regions of the pullup transistor, wherein the second semiconductor pillar comprises the source/drain regions of the pulldown transistor; and wherein the first reference voltage is greater than the second reference voltage.

18. The device of claim 17 wherein the first reference voltage is VDD and the second reference voltage is ground.

19. The device of claim 14 wherein the insulative layer and the insulative block both comprise a same composition.

20. The device of claim 14 wherein the insulative layer and the insulative block both comprise silicon dioxide.

* * * * *